(12) United States Patent
Noda

(10) Patent No.: US 7,339,500 B2
(45) Date of Patent: Mar. 4, 2008

(54) ENCODING METHOD AND DECODING METHOD

(75) Inventor: Makoto Noda, Tokyo (JP)

(73) Assignee: Sony Corporation, Tokyo (JP)

( * ) Notice: Subject to any disclaimer, the term of this patent is extended or adjusted under 35 U.S.C. 154(b) by 617 days.

(21) Appl. No.: 10/433,442

(22) PCT Filed: Oct. 2, 2002

(86) PCT No.: PCT/JP02/10247

§ 371 (c)(1), (2), (4) Date: Nov. 10, 2003

(87) PCT Pub. No.: WO03/032497

PCT Pub. Date: Apr. 17, 2003

(65) Prior Publication Data

US 2005/0220197 A1    Oct. 6, 2005

(30) Foreign Application Priority Data

Oct. 3, 2001    (JP) .............................. 2001-307159

(51) Int. Cl.
H03M 11/00 (2006.01)
H03M 5/00 (2006.01)
H03M 7/00 (2006.01)
H04L 27/06 (2006.01)
H04L 27/00 (2006.01)

(52) U.S. Cl. ........................... 341/50; 341/58; 341/59; 375/341; 375/259; 375/262; 375/265

(58) Field of Classification Search ................ 375/240, 375/259, 265, 262, 341, 295; 714/225, 792, 714/788, 790, 794–797, 725; 341/101, 106, 341/50, 58–59
See application file for complete search history.

(56) References Cited

U.S. PATENT DOCUMENTS 5,627,694 A *   5/1997   Ido et al. ...................... 360/51

(Continued)

FOREIGN PATENT DOCUMENTS

JP    11-186917    7/1999

(Continued)

OTHER PUBLICATIONS

L. Fredricson, et al., "Trellis Coding in the Venus PRML Read/Write Channel," IEEE trans. on Magn., vol. 33, No. 5, pp. 2743-2745, Sep. 1997.

(Continued)

*Primary Examiner*—Mohammed Ghayour
*Assistant Examiner*—Sophia Vlahos
(74) *Attorney, Agent, or Firm*—Finnegan, Henderson, Farabow, Garrett, & Dunner, L.L.P.

(57) ABSTRACT

The present invention allows two different block codes to be encoded by one-type of encoding section. A first-point-fixed encoding section divides m-bit data into a first-half code and a second-half code, and encodes them into an n-bit provisional code with fixed start-point state. A code A/B counter receives a reset-signal and outputs a code selection signal to a code-order reversing section and a top-code correction section. The code-order reversing section receives a codeword excluding the top code from the start-point-fixed encoding section; and outputs the codeword as is, when the code selection signal indicates a code B, and reverses the order of the codeword to generate a new codeword, and outputs the new codeword to a latch, when the code selection signal indicates a code A. The top-code correction section determines whether the top code needs to be modified, and modifies the top code, if necessary.

15 Claims, 23 Drawing Sheets

U.S. PATENT DOCUMENTS

| | | | |
|---|---|---|---|
| 5,633,632 A * | 5/1997 | Ido et al. | 341/58 |
| 5,646,950 A * | 7/1997 | Varanasi et al. | 714/792 |
| 5,917,863 A * | 6/1999 | Soichi et al. | 375/341 |
| 6,154,504 A * | 11/2000 | Ino | 375/265 |
| 6,414,608 B1 * | 7/2002 | Nishida et al. | 341/67 |
| 6,633,243 B2 * | 10/2003 | Mair et al. | 341/50 |
| 6,829,299 B1 * | 12/2004 | Chujoh et al. | 375/240 |
| 6,850,573 B1 * | 2/2005 | Noda | 375/262 |

FOREIGN PATENT DOCUMENTS

| | | |
|---|---|---|
| JP | 11-215003 | 8/1999 |
| JP | 11-312983 | 11/1999 |
| JP | 11-312984 | 11/1999 |
| JP | 2000-124815 | 4/2000 |
| JP | 2000-134112 | 5/2000 |

OTHER PUBLICATIONS

M. Noda, "A High-Rate Matched Spectral Null Code," IEEE Trans. on Mag., vol. 34, No. 4, pp. 1946-1948, Jul. 1998.

Wldmer and P. Franaszec, "A DC-Balanced, Partitioned-Block, 8B/10B Transmission Code," IBM J. Res. Develop., vol. 27, No. 5, pp. 440-451, Sep. 1983.

T.M. Cover, "Enumerative Source Coding," IEEE Trans. on Info. Theory, vol. IT-19, No. 1, pp. 73-77, Jan. 1973.

* cited by examiner

FIG. 13A

```
         24-BIT DATA WORD
000000000000000000000000
000000000000000000000001
              ⋮
```

FIG. 13B

```
      27-BIT PROVISIONAL CODEWORD
000010000010000100000100010
000010000010000101011101001
```

FIG. 13C

```
A/B      27-BIT CODEWORD
A  101000100000100001000001000
B  000010000010000101011101001
```

FIG. 18A

26-BIT DETECTED CODEWORD 01000100000100001000001000
00010000010000101011101001

| A/B | 27-BIT CODEWORD |
|---|---|
| A | 000010000010000100000100010 |
| B | 000010000010000101011101001 |

FIG. 18C

24-BIT DATA WORD 000000000000000000000000
000000000000000000000001

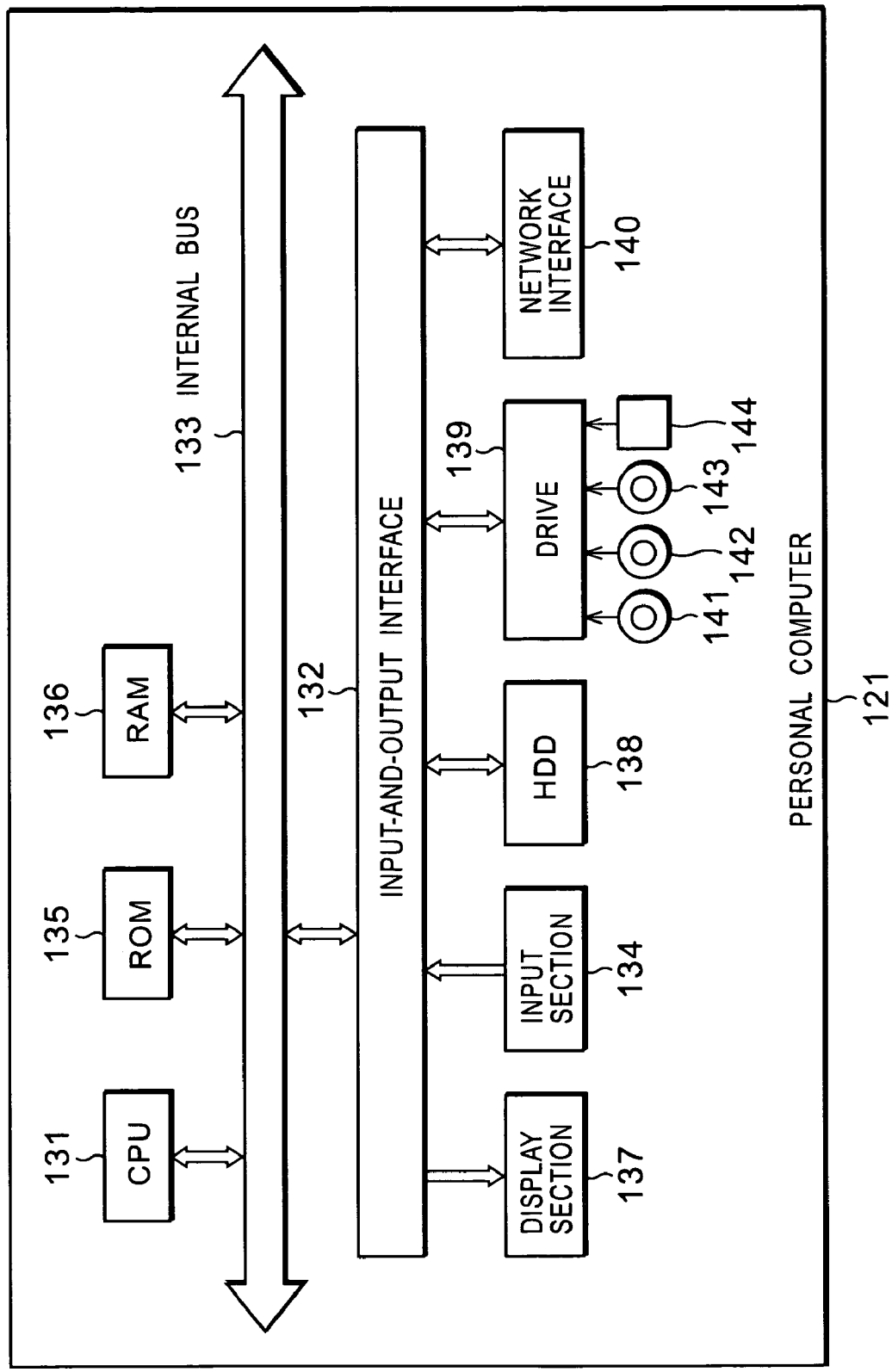

ENCODING METHOD AND DECODING METHOD

TECHNICAL FIELD

The present invention relates to encoding methods and decoding methods, and for example, to an encoding method and a decoding method suited to a case in which two different types of block codes in which one code has a reverse order against a part of the other code are alternately encoded or decoded for every single codeword in various recording and reproduction apparatuses, including magnetic recording and reproduction apparatuses, such as digital video tape recorders and hard disk drives for computers or others, and magneto-optical recording and reproduction apparatuses, such as magneto-optical disk drives, various communication apparatuses, and others.

BACKGROUND ART

Recently in various recording and reproduction apparatuses and communication apparatuses, input data has been encoded to reduce the data error rate of a digital transfer signal.

FIG. 1 is a block diagram of a digital signal processing circuit in a general recording and reproduction apparatus.

An encoding section 1 encodes input data at a ratio of m:n, where m indicates a data bit length before encoding and n indicates a data bit length after encoding. A D/A converter 2 converts an input recording code from a digital signal to an analog signal, that is, to a recording rectangular wave. A recording and reproduction section 3 includes, for example, a magnetic head, an optical pickup, and a control circuit for controlling the driving thereof, and records the recording wave input from the D/A converter 2 in a recording medium not shown.

The recording and reproduction section 3 reproduces a signal recorded in the recording medium, and outputs an analog reproduced wave to an analog equalizer 4. The analog equalizer 4 equalizes the reproduced wave input from the recording and reproduction section 3 so as to have a predetermined target equalization characteristic.

An A/D converter 5 includes a PLL (phase locked loop) circuit. It may be a hybrid digital PLL in which only phase error detection is performed by a digital section, or a full digital PLL in which both phase error detection and signal synchronization are performed by a digital section.

When equalization applied by the analog equalizer 4 is insufficient, a digital equalizer may further be provided between the A/D converter 5 and a code detection section 6. In this case, instead of the analog equalizer 4, a low-pass filter may be provided.

The code detection section 6 is formed recently of a maximum-likelihood detector generally, and converts an input digital reproduced signal, that is, an equalized signal to a code. In other words, the code detection section 6 detects a code. A decoding section 7 decodes an input detected code at a ratio of n:m to generate output data and output it.

In FIG. 1, as a code used in the encoding section 1, various codes have been made practical. These codes are basically divided into convoluted codes and block codes. Consecutive encoding is performed for convoluted codes whereas an information string is partitioned and independent codes are generated for block codes. In recording and reproduction apparatuses, block codes are generally used in many cases, which provide a relatively successful characteristic even at a large encoding rate.

For example, an 8/9 conversion code and a 16/17 conversion code have been made practical for recording and reproduction apparatuses which use a hard disk, and an 8/10 conversion code and a 16/20 conversion code have been made practical for 3.8-mm and 8-mm tape streamer magnetic recording and reproduction apparatuses. For these block codes which have been made practical, one type of conversion rule is repeatedly applied to all blocks of input data to execute encoding and decoding.

Contrarily, an idea has been proposed in which two different types of block codes are alternately and repeatedly applied and the encoded blocks thereof are concatenated to configure a trellis code having a high encoding rate and a reduced data error rate. The trellis code in which two different types of block codes are alternately concatenated is hereinafter called an "alternate-conversion trellis code".

For example, a paper, L. Fredricson, et al., "Trellis coding in the Venus Read/Write Channel," IEEE trans. on Magn., vol. 33, No. 5, pp. 2743-2745, September, 1997, discloses an alternate-conversion trellis code which can configure a 12/15 conversion trellis code having an encoding rate of 0.8. Japanese Unexamined Patent Application Publication No. Hei-11-186917, and another paper, M. Noda, "High-Rate Matched Spectral Null code," IEEE Trans. on Magn., vol. 34, No. 4, pp. 1946-1948, July, 1998, disclose the structure of a code having a higher encoding rate. With the use of this technology, a 24/27 conversion trellis code having an encoding rate of about 0.889, for example, can be configured.

It has been pointed out in these alternate-conversion trellis codes that, when the number of codeword bits is odd, one of two different types of block codes can be converted in a simple circuit to obtain the other block code. Therefore, it is estimated that a circuit for executing substantial encoding and decoding with an alternate-conversion trellis code can be implemented at almost the same size as that of a circuit used with one type of block code.

In the alternate-conversion trellis code disclosed in the paper, L. Fredricson, et al., "Trellis coding in the Venus Read/Write Channel," IEEE trans. on Magn., vol. 33, No. 5, pp. 2743-2745, September, 1997, NRZ (non return to zero) modulation is a prerequisite, and by reversing the order of one block code of two different types of block codes and by inverting all codewords so as to satisfy a transition state, the other block code can be obtained.

In the alternate-conversion trellis code disclosed in the another paper, M. Noda, "High-Rate Matched Spectral Null code," IEEE Trans. on Magn., vol. 34, No. 4, pp. 1946-1948, July, 1998, NRZI (non return to zero inverted (non return to zero on one)) modulation is a prerequisite, and by reversing the order of one block code of two different types of block codes, by shifting by one bit, and by inverting, if necessary, only the top code so as to satisfy a transition state, the other block code can be obtained.

In one of the problems of conventional technologies related to encoding and decoding, since code conversion having a long bit constraint length generates a large number of converted codewords, if conversion is performed directly, a circuit for executing encoding and decoding becomes complicated exponentially corresponding to the bit constraint length.

As one of specific countermeasures to solve this problem, for example, there is a code division method, which substantially reduces a required number of converted codewords. When the code division method disclosed in a paper, a. Wldmer and P. Franaszec, "A DC-Balanced, Partitioned-Block, 8B/10B Transmission Code," IBM J. Res. Develop., Vol. 27, No. 5, pp. 440-451, September, 1983, is used, an 8/10 conversion DC free code is code-divided into two independent 3/4 conversion code and 5/6 conversion code to reduce the required number of converted codewords from the eighth power of 2, that is, 256, to the sum of the third power of 2 and the fifth power of 2, that is, 40, which is a reduction of about 84 percent.

When the code division method disclosed in Japanese Unexamined Patent Application Publication No. Hei-11-215003 is used, a 16/18 conversion DC free code is code-divided into two independent 7/8 conversion code and 9/10 conversion code to reduce the required number of converted codewords from the 16th power of 2, that is, 65,536, to the sum of the seventh power of 2 and the ninth power of 2, that is, 640, which is a reduction of about 99 percent.

These code division methods have been discovered and applied by individually checking their converted codes. They cannot be applied to all codes.

For the alternate-conversion trellis codes described above, a combination of such code division methods is possible in some cases. Then, it is possible to much reduce the size of a circuit for executing encoding and decoding. According to M. Noda, "High-Rate Matched Spectral Null code," IEEE Trans. on Magn., vol. 34, No. 4, pp. 1946-1948, July, 1998, for example, only one of two different block codes alternately used in 24/27 conversion trellis code is code-divided into two independent 12/13 conversion code and 12/14 conversion code to reduce the required number of converted codewords from the 24th power of 2, that is, 16,777,216 to the sum of the 12th power of 2 and the 12th power of 2, that is, 8,192, which is a reduction of about 99.95 percent.

As described above, two different types of block codes are used in the alternate-conversion trellis code disclosed in Japanese Unexamined Patent Application Publication No. Hei-11-186917, and the another paper, M. Noda, "High-Rate Matched Spectral Null code," IEEE Trans. on Magn., vol. 34, No. 4, pp. 1946-1948, July, 1998, by reversing the order of one block code of the two different types of block codes, by shifting by one bit, and by inverting, if necessary, only the top code so as to satisfy a transition state, the other block code can be obtained.

To make such an alternate-conversion trellis code which uses NRZI modulation practical, however, it is necessary to determine whether the top code is to be inverted or not by determining whether a transition state is satisfied. A specific condition determination method has not yet been decided. In addition, a technology which implements processing for determining a condition to determine whether the top code is to be inverted or not, and, if necessary, for inverting the code, that is, a specific circuit structure which can be implemented, has not yet been clarified. Further, a method for decoding the converted top code to generate the original code has also not been decided.

Furthermore, similarly, to also make an alternate-conversion trellis code to which a code division method is applied practical, it is necessary to determine whether the top code is to be inverted or not by determining whether a transition state is satisfied, and the converted top code needs to be decoded to generate the original code. But a specific condition determination method therefore or a circuit structure therefor has not yet been clarified.

DISCLOSURE OF INVENTION

The present invention has been made in consideration of such conditions. An object of the present invention is, when an alternate-conversion trellis code to which a code division method is applied is implemented, to determine whether a transition state is satisfied to determine whether a top code is to be inverted, and to allow a converted top code to be returned to the original code in decoding.

An encoding method, a program recorded in a recording medium, and a program according to a first aspect of the present invention are characterized by including a provisional-encoding step of using a conversion rule of a first block code to perform provisional encoding; a selection step of outputting a selection signal which selects the first block code or a second block code having an order reverse to that of the first block code; and a top-bit determination step of determining the top bit of a final codeword according to the top code and the end-point state of a provisional codeword obtained by the process of the provisional-encoding step and the selection signal output by the process of the selection step.

An end-point-state determination step of determining the end-point state of the final codeword according to the top code and the end-point state of the provisional codeword obtained by the process of the provisional-encoding step and the selection signal output by the process of the selection step may be further included.

The process of the provisional-encoding step may be configured such that a code division method is used to execute provisional encoding, and the final codeword is determined after provisional encoding is finished for all division codes of the codes.

The maximum run length of the code may be limited to a finite value.

The amplitude of the accumulated charge of the code may be limited to a finite value.

The code may have two different states.

An encoding apparatus according to the first aspect of the present invention is characterized by including a provisional-encoding section for using a conversion rule of a first block code to perform provisional encoding; a selection-signal output section for outputting a selection signal which selects the first block code or a second block code having an order reverse to that of the first block code; and a top-bit determination section for determining the top bit of a final codeword according to the top code and the end-point state of a provisional codeword obtained by the provisional-encoding section and the selection signal output from the selection-signal output section.

An encoding method, a program recorded in a recording medium, and a program according to a second aspect of the present invention are characterized by including a provisional-encoding step of using a conversion rule of a first block code to perform provisional encoding; a selection step of outputting a selection signal which selects the first block code or a second block code having an order reverse to that of the first block code; a selective order-reversing conversion step of reversing the order of a provisional code generated by the process of the provisional-encoding step, if necessary, to output it, or of outputting the provisional code as is if order reversing is not necessary, according to the selection signal output by the process of the selection step; and a top-code determination step of applying state inspection to the provisional code except for the top code, output by the process of the selective order-reversing conversion step to determine the top code of a final codeword.

The process of the provisional-encoding step may be configured such that a code division method is used to execute provisional encoding, and the final codeword is determined after provisional encoding is finished for all division codes of the codes.

An encoding apparatus according to the second aspect of the present invention is characterized by including a provisional-encoding section for using a conversion rule of a first block code to perform provisional encoding; a selection-signal output section for outputting a selection signal which selects the first block code or a second block code having an order reverse to that of the first block code; a selective order-reversing conversion section for reversing the order of a provisional code generated by the provisional-encoding section, if necessary, to output it, or for outputting the provisional code as is if order reversing is not necessary, according to the selection signal output from the selection-signal output section; and a top-code determination section for applying state inspection to the provisional code except for the top code, output from the selective order-reversing conversion section to determine the top code of a final codeword.

A decoding method according to the present invention, and a program recorded in a recording medium according to a third aspect, and a program are characterized by including a detected-code obtaining step of obtaining a detected code; a top-code estimation step of applying state inspection to the detected code except the top code, obtained by the process of the detected-code obtaining step to estimate a new top code; and a decoding step of decoding the new top code estimated by the process of the top-code estimation step and the detected code except the top code, obtained by the process of the detected-code obtaining step.

The process of the decoding step may be configured such that a code division method is used to perform decoding, and the end-point state of the top division code among division codes is used to decode subsequent division codes.

A decoding apparatus according to the present invention is characterized by including a detected-code obtaining section for obtaining a detected code; a top-code estimation section for applying state inspection to the detected code except the top code, obtained by the detected-code obtaining section to estimate a new top code; and a decoding section for decoding the new top code estimated by the top-code estimation section and the detected code except the top code, obtained by the detected-code obtaining section.

In an encoding method, an encoding apparatus, and a program according the first aspect of the present invention, provisional encoding is performed by using a conversion rule of a first block code; a selection signal for selecting the first block code or a second block code having an order reverse to that of the first block code; and the top bit of a final codeword is determined according to the top code and the end-point state of a provisional codeword and the selection signal.

In an encoding method, an encoding apparatus, and a program according the second aspect of the present invention, provisional encoding is performed by using a conversion rule of a first block code; a selection signal for selecting the first block code or a second block code having an order reverse to that of the first block code; the order of a provisional code is reversed, if necessary, and the result is output, or the provisional code is output as is if order reversing is not necessary, according to the output selection signal; and state inspection is applied to the output provisional code except for the top code to determine the top bit of a final codeword.

In a decoding method and a decoding apparatus according to the present invention, and a program according to a third aspect of the present invention, a detected code is obtained; state inspection is applied to the obtained detected code except for the top code to estimate a new top code; and the estimated new top code, and the obtained detected code except the top code are decoded.

BRIEF DESCRIPTION OF THE DRAWINGS

FIG. 13A is a view showing example specific data.

FIG. 13B is a view showing an example specific provisional codeword.

FIG. 13C is a view showing an example specific codeword.

FIG. 18A is a view showing an example specific detected codeword.

FIG. 18B is a view showing an example specific codeword.

FIG. 18C is a view showing example specific data.

FIG. 23 is a block diagram showing the structure of a personal computer.

BEST MODE FOR CARRYING OUT THE INVENTION

Figure 1:
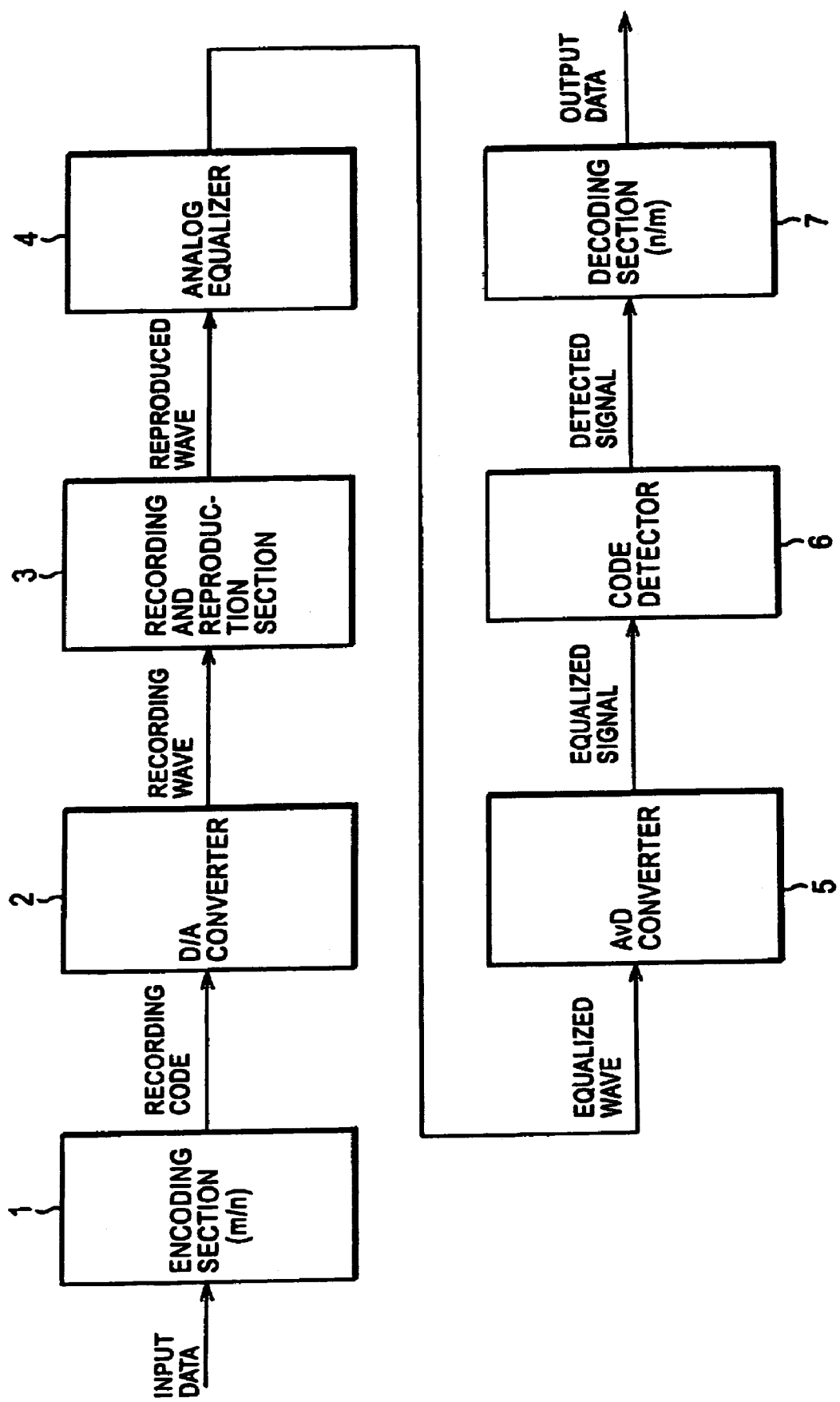
FIG. 1 is a block diagram showing the structure of a general recording and reproduction apparatus.

Embodiments of the present invention will be described below by referring to the drawings.

Figure 2:
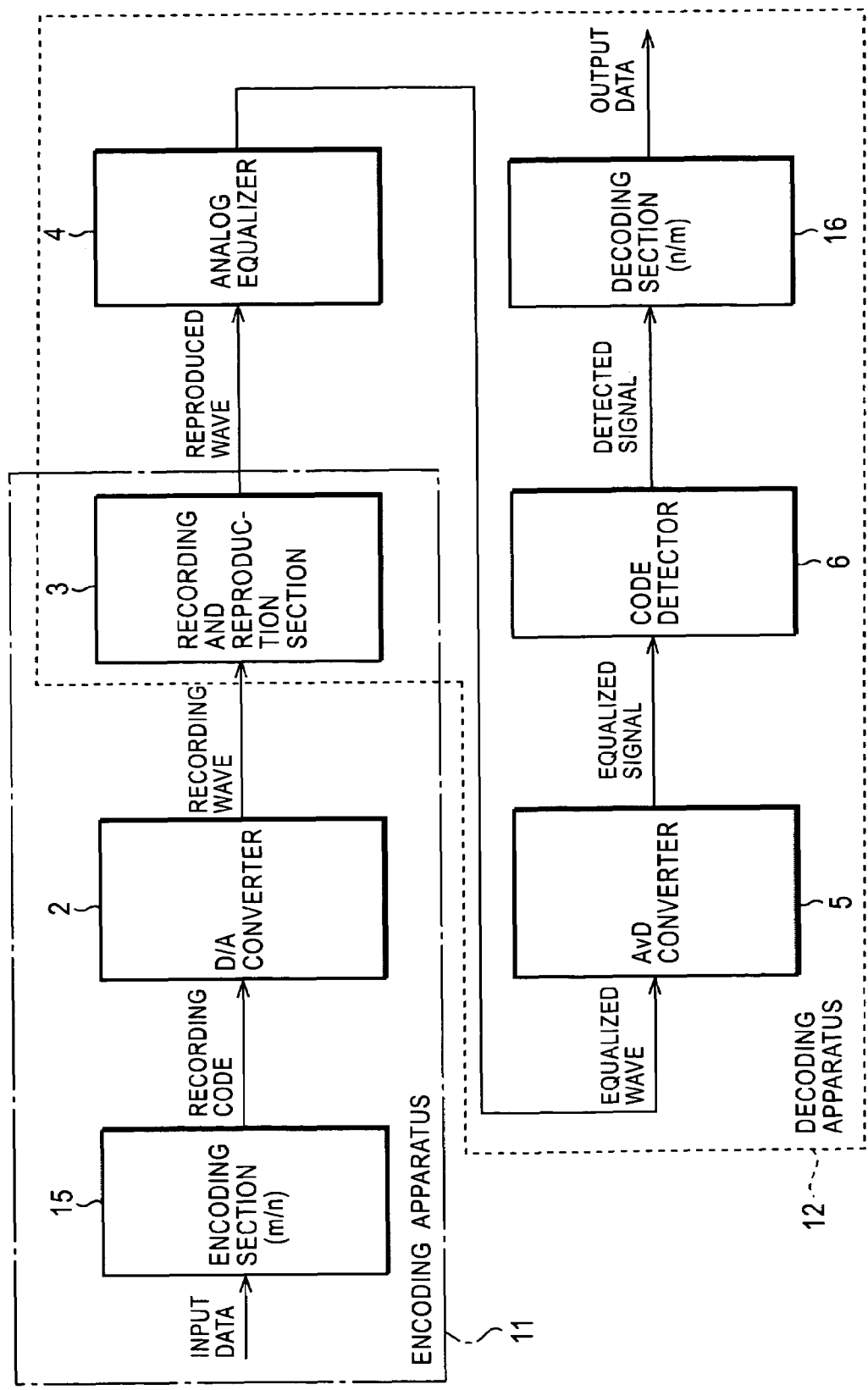
FIG. 2 is a block diagram showing the structure of a recording and reproduction apparatus to which the present invention is applied.

FIG. 2 is a block diagram of a digital signal processing circuit in a recording and reproduction apparatus to which the present invention is applied. The same symbols as those used in the conventional case are assigned to the portions corresponding to those shown in the conventional case, and therefore, descriptions thereof are omitted. More specifically, the recording and reproduction apparatus shown in FIG. 2 has the same structure as in the case shown in FIG. 1 except that an encoding section 15 is provided instead of the encoding section 1, and a decoding section 16 is provided instead of the decoding section 7.

The recording and reproduction apparatus shown in FIG. 2 may be structured as two separate apparatuses, an encoding apparatus 11 formed of the encoding section 15, a D/A conversion section 2, and a recording and reproduction section 3, and a decoding apparatus 12 formed of the recording and reproduction section 3, an analog equalization circuit 4, an A/D converter 5, a code detector 6, and the decoding section 16.

In the recording and reproduction apparatus and the decoding apparatus 12 shown in FIG. 2, when equalization applied by the analog equalizer 4 is insufficient, a digital equalizer may further be provided between the A/D converter 5 and the code detector 6 in the same way as described for the conventional case by using FIG. 1. In that case, a low-pass filter may be provided instead of the analog equalizer 4.

It is assumed that the alternate-conversion trellis code disclosed in Japanese Unexamined Patent Application Publication No. Hei-11-186917, and the another paper, M. Noda, "High-Rate Matched Spectral Null code," IEEE Trans. on Magn., vol. 34, No. 4, pp. 1946-1948, July, 1998 is used in encoding executed by the encoding section 15 and in decoding executed by the decoding section 16.

Figure 3:
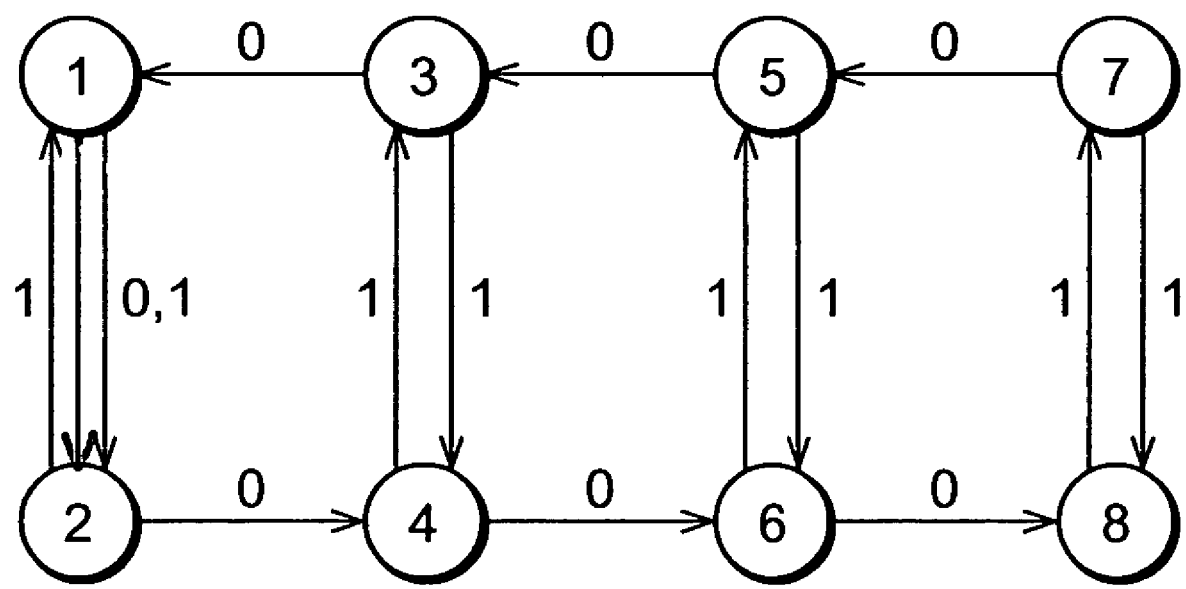
FIG. 3 is a view used for describing a state transition diagram having eight states, used in the present invention.

FIG. 3 is a state transition diagram of eight states used for code generation at a prerequisite of NRZI modulation where a code DSV (digital sum variation) is limited to eight. DSV indicates the amplitude of the accumulative DC charge RDS (running digital sum) of a code sequence.

RDS indicates the sum of symbols from the start point of time, that is, the start point, of the code sequence, obtained when +1 and −1 are assigned respectively to symbols "1" and "0" of the code. The DC component of the power spectrum of a code in which the amplitude DSV of the code RDS is limited finitely has a spectral null.

According to the state transition diagram, when a state transition occurs in the order of 7, 5, 3, 1, 2, 4, 6, and 8, symbol 0 continues most. The maximum magnetization inversion interval Tmax is 8Ts. By removing a redundant codeword in code conversion, Tmax is set to 7Ts. Ts indicates the time interval of a system clock. When NRZI modulation is a prerequisite, the maximum magnetization inversion interval is obtained by adding one to the so-called maximum run length of the code sequence and by multiplying the sum by Ts. When NRZ modulation is a prerequisite, the maximum magnetization inversion interval is obtained by multiplying the maximum run length by Ts.

A 24/27 conversion code which starts at state 2 and state 3 and ends at state 4 and state 5 in the state transition diagram shown in FIG. 3, and a 24/27 conversion code which starts at state 4 and state 5 and ends at state 2 and state 3 are alternately used. This means that alternate-conversion trellis codes are used.

Figure 4A:
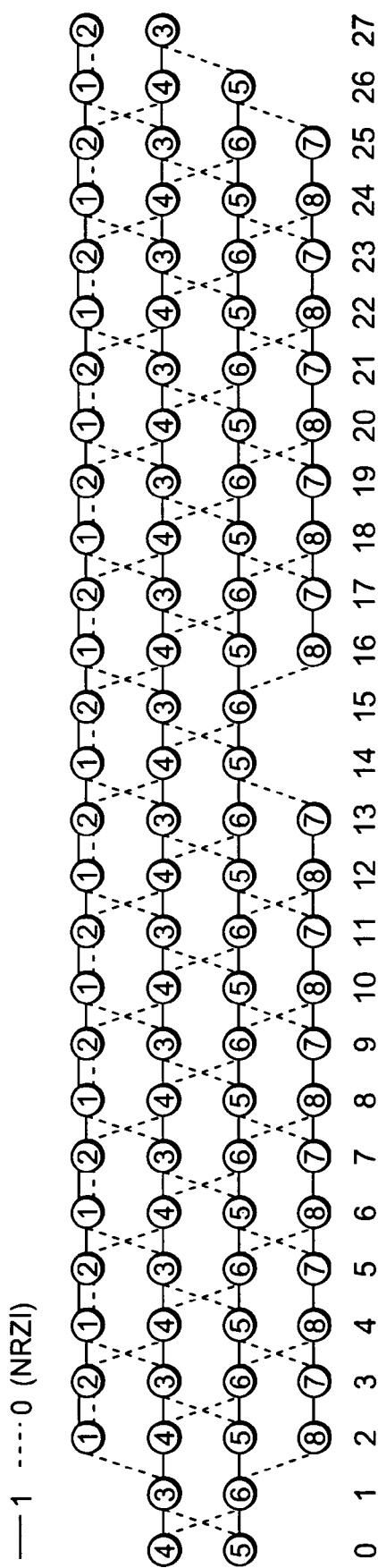
FIG. 4A is a view used for describing a state transition trellis diagram.
Figure 4B:
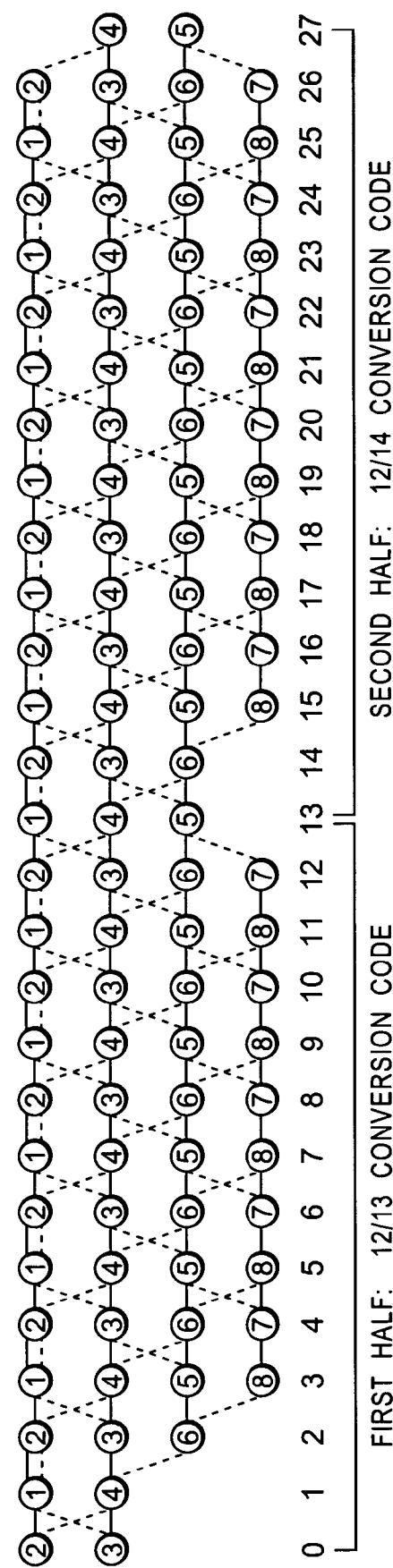
FIG. 4B is a view used for describing a state transition trellis diagram.

FIG. 4 is a state transition trellis diagram of the alternate-conversion 24/27 trellis codes. FIG. 4A shows the 24/27 conversion code which starts at state 4 and state 5 and ends at state 2 and state 3 and FIG. 4B shows the 24/27 conversion code which starts at state 2 and state 3 and ends at state 4 and state 5. Numerals shown in FIG. 4 correspond to the states of the state transition diagram described by using FIG. 3. Solid lines and dot lines output from each state mean that a code before NRZI modulation is 1 and 0, respectively.

When encoding to which the state transition trellis diagram of the alternate-conversion 24/27 trellis codes is applied is executed, a code sequence for which an estimated code may be not decided at code maximum likelihood detection, that is, a quasi-catastrophic code sequence QCS, is removed, and at the same time, the 24/27 code, which has a high encoding rate, is divided into a 12/13 conversion code and a 12/14 conversion code to perform encoding and decoding. Therefore, with a practical circuit size of about several thousand gates, the encoding section 15 and the decoding section 16 can be configured.

In this case, only a code B can be divided into the 12/13 conversion code and the 12/14 conversion code to perform encoding and decoding. A code A is obtained by converting the code B.

To encode a code having a plurality of start-point states and end-point states, it is necessary to obtain the end-point state of the code at every time and to store it.

When the code A and the code B are used as two totally different codes (the code A is not obtained by converting the code B) to form an alternate-conversion trellis code and are separately encoded, for example, if an encoding circuit is provided for each code and the end-point state of each code is separately determined, the end-point state of each code is easily obtained. A method for configuring a state determination unit which separately determines the state of each code of an alternate-conversion trellis code in this way is disclosed, for example, in Japanese Unexamined Patent Application Publication No. Hei-11-312983.

When the method disclosed in Japanese Unexamined Patent Application Publication No. Hei-11-312983 is used, however, two types of circuits for encoding a block code are required. To avoid such an increase in circuit scale, it is effective that an encoding section is provided only for the code B and the code A is obtained by converting the code B. Therefore, it is necessary to determine the top code and the end-point state of the code A when the code B is converted to the code A.

Figure 5A:
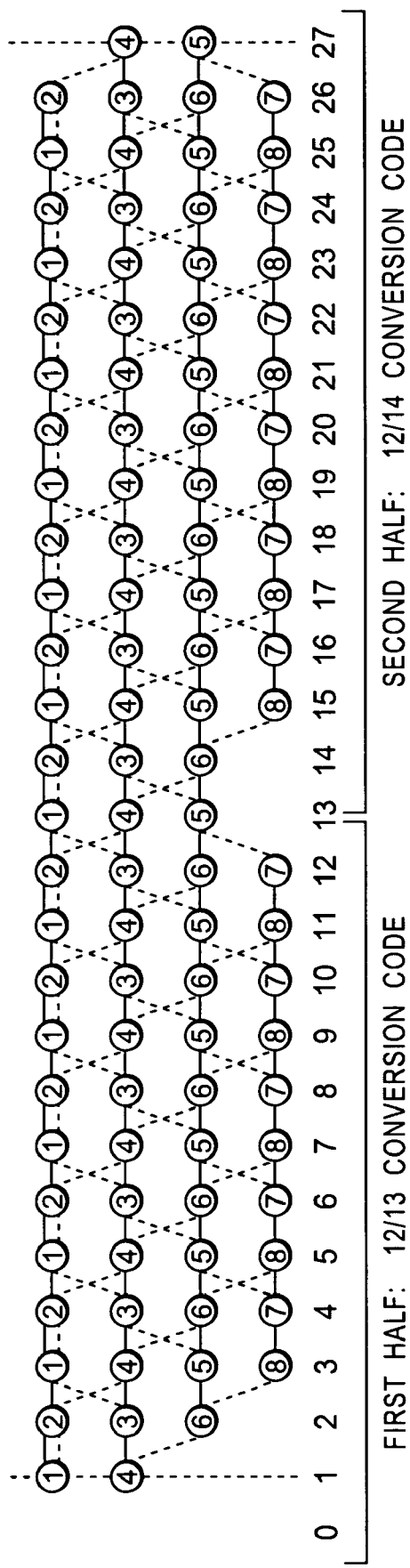
FIG. 5A is a view used for describing a state transition trellis diagram.
Figure 5B:
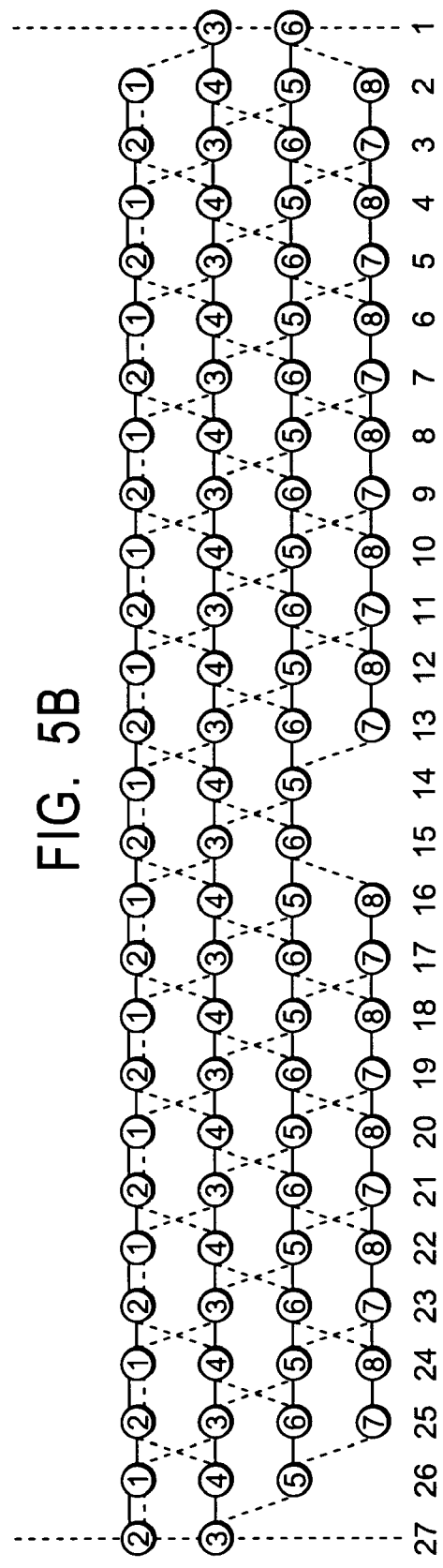
FIG. 5B is a view used for describing a state transition trellis diagram.

When a second bit to a 27-th bit of the code B shown in a state transition trellis of FIG. 4B, that is, the trellis except for a first bit, which is the top bit, is observed in the reverse order, in other words, is observed in a direction from the 27-th bit to the second bit, it is found that the trellis except for the first bit has the same structure as a second bit to a 27-th bit of the code A shown in a state transition trellis of FIG. 4A. In other words, a trellis diagram shown in FIG. 5A, which indicates the code B from the second bit (the top bit is removed) and a trellis diagram shown in FIG. 5B, which indicates the code A arranged in the reverse order with the top bit being removed have different state numbers and the same transition patterns of "1" and "0" indicated by solid lines and dotted lines in the figures. With the use of this characteristic, two rules can be found which are applied to a case in which the code B is converted to generate the code A.

A first rule, rule 1, will be first described. When the code B is encoded, if its end-point state is 4 irrespective of the start-point state of the code B, the code state of the first bit of the code A obtained when the code B is converted to the code A is 3. Therefore, in this case, the top code of the code A is "1" when the end-point state of the code at the previous time is 4, and the top code of the code A is "0" when the end-point state of the code at the previous time is 5. In the same way, when the code B is encoded, if its end-point state is 5 irrespective of the start-point state of the code B, the code state of the first bit of the code A obtained when the code B is converted to the code A is 6. Therefore, in this case, the top code of the code A is "0" when the end-point state of the code at the previous time is 4, and the top code of the code A is "1" when the end-point state of the code at the previous time is 5.

A second rule, rule 2, will be described next. When the code B is encoded, if its start-point is fixed to state 3, the end-point state of the code A obtained when the code B is converted to the code A is 3 if the code of the first bit of the code B is "1". In the same way, the end-point state of the code A obtained when the code B is converted to the code A is 2 if the code of the first bit of the code B is "0". In the same way, when the code B is encoded, if its start-point is fixed to state 2, the end-point state of the code A obtained when the code B is converted to the code A is 2 if the code of the first bit of the code B is "1", and the end-point state of the code A obtained when the code B is converted to the code A is 3 if the code of the first bit of the code B is "0".

With the two rules described above, the top code of the code A obtained after conversion can be determined from the end-point state of the code at the previous time and the end-point state of the code B. The end-point state of the code A obtained after conversion can be determined from the top code of the code B obtained when its start-point state is fixed. When the code B, not the code A, is encoded, only if the end-point state of the code at the previous time is different from the end-point state of the fixed code B, it is necessary to invert the top code of the code B.

Figure 6:
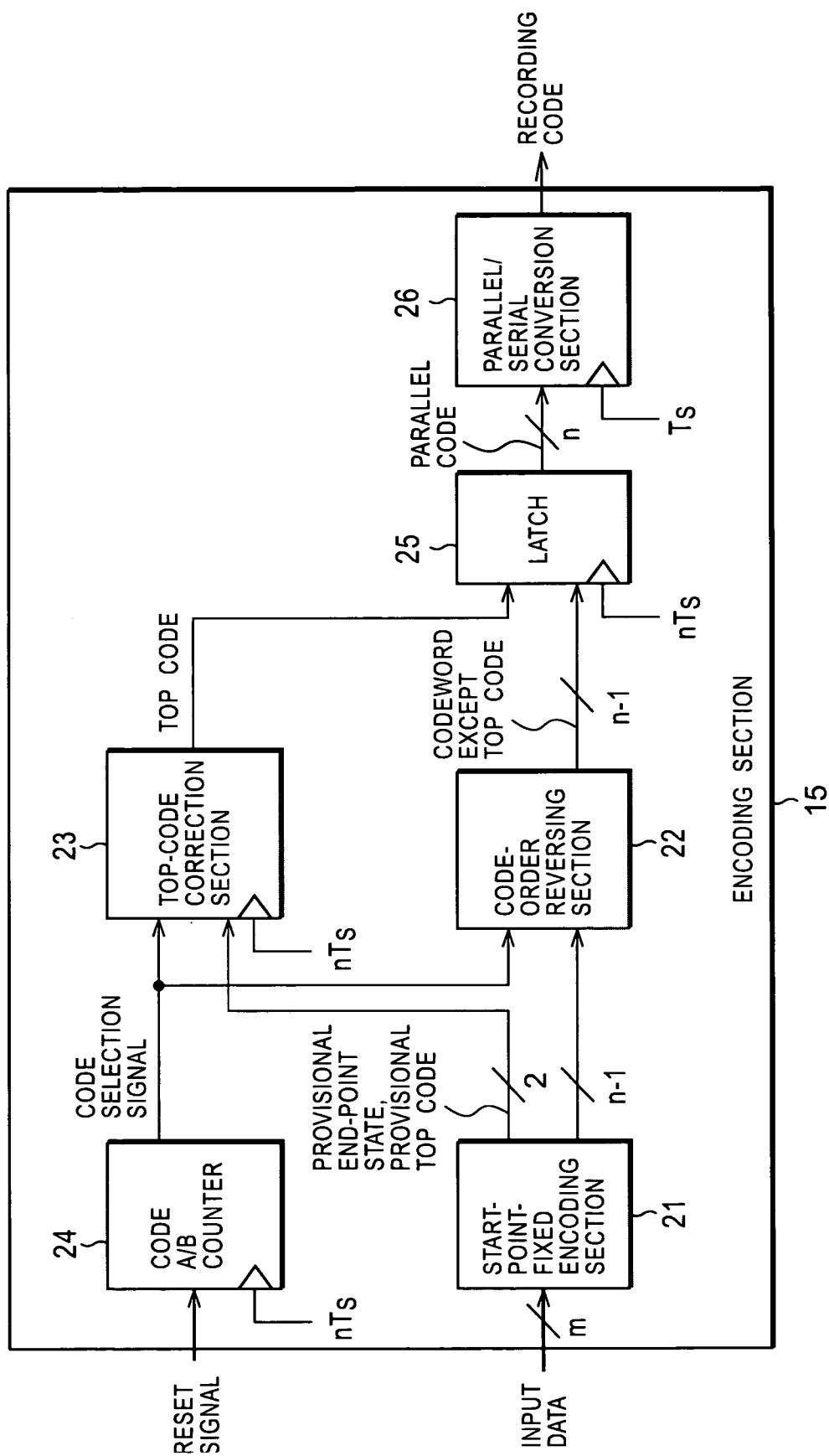
FIG. 6 is a block diagram showing a further detailed structure of an encoding section shown in FIG. 3.

FIG. 6 is a block diagram showing an example further detailed structure of the encoding section 15 for encoding the code A and the code B, with the above-described two rules being applied.

An input m-bit data is converted to an n-bit provisional code having a fixed start-point state by a start-point-fixed encoding section 21. Since 24/27 conversion is executed here, m=24 and n=27.

Figure 7:
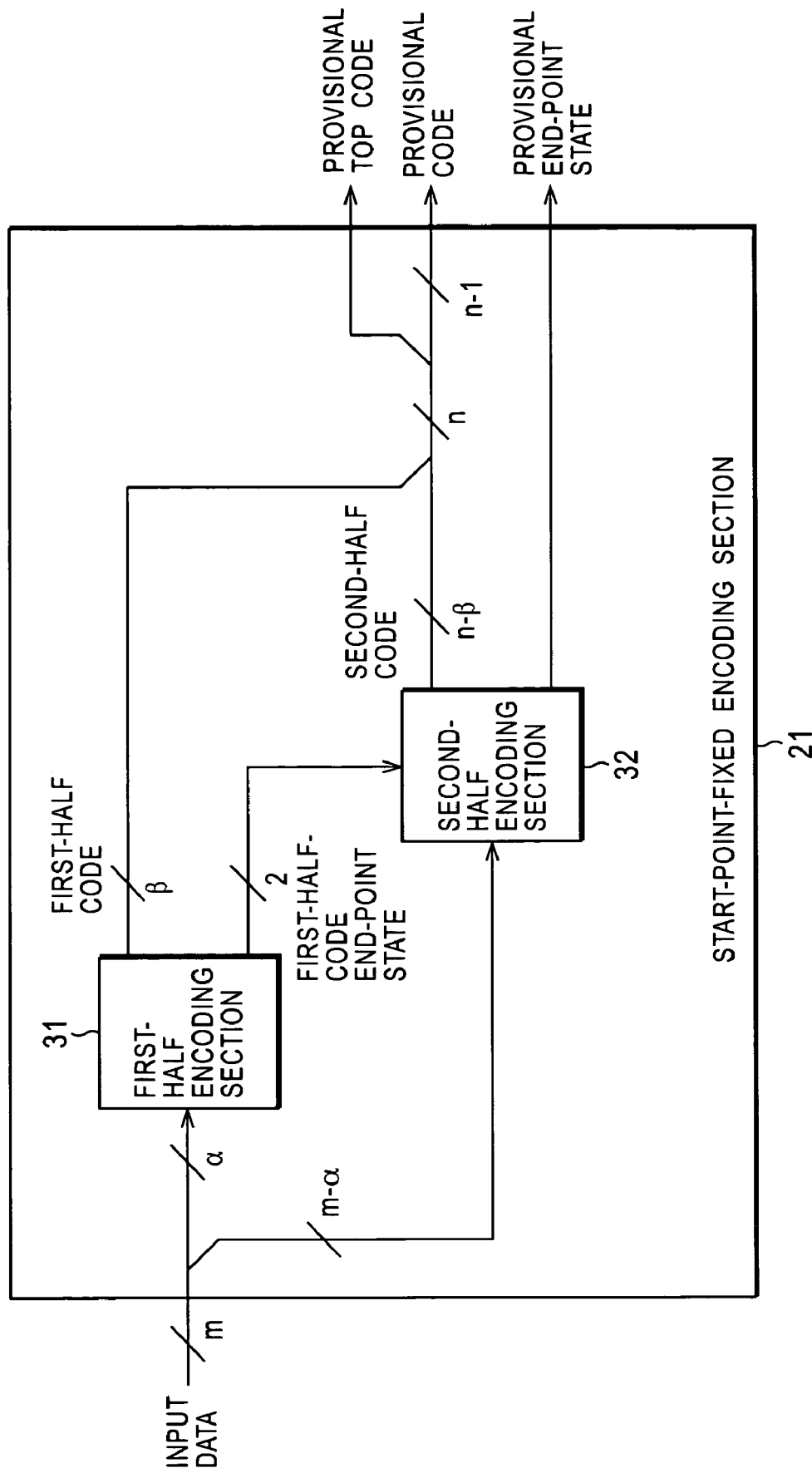
FIG. 7 is a block diagram showing a further detailed structure of a first-point-fixed encoding section shown in FIG. 6.

FIG. 7 is a block diagram showing an example further detailed structure of the start-point-fixed encoding section 21.

Among the m-bit data, α-bit first-half data is input to a first-half encoding section 31, and (m−α)-bit second half data is input to a second-half encoding section 32. Since the 24/27 code is divided into the 12/13 conversion code and the 12/14 conversion code and they are encoded, α=12.

The first-half encoding section 31 receives the α-bit first-half data, performs encoding with the first-point state being fixed, outputs a β-bit first-half code, and also outputs two-bit first-half-code end-point state information to the second-half encoding section 32. Since the 12/13 conversion code is obtained by encoding, β=13. As described by referring to FIG. 4, since there are three end-point states of the first-half code, 1, 4, and 5, it is possible to indicate the first-half-code end-point state information by two bits.

The second-half encoding section 32 receives the (m−α)-bit second-half data and the two-bit first-half-code end-point state information, performs encoding, generates and outputs (n−β)-bit second-half code, and also outputs one-bit provisional-end-point-state information to a top-code correction section 23 shown in FIG. 3. As described by referring to FIG. 4, since there are two end-point states of the second-half code, 4 and 5, it is possible to indicate the end half-code end-point state information by one bit.

The first-half encoding section 31 and the second-half encoding section 32, described by referring to FIG. 7, may use any encoding methods to perform encoding. For example, when a circuit is formed so as to arrange codewords in the order of magnitude from the smallest or from the largest and to perform encoding by using the already-well-known enumerative source coding method, its circuit scale is about 3000 gates in the first-half encoding section 31 and the second-half encoding section 32 in total. Details of the enumerative source coding method are described, for example, in a paper, "Enumerative source coding," T. M. Cover, IEEE Trans. on Info. Theory, Vol. IT-19, No. 1, pp. 73-77, January, 1973.

Then, the β-bit first-half code and the (n−β)-bit second-half code are concatenated to generate provisional codeword. The provisional codeword having (n−1) bits, which does not include the top code, is output to a code-order reversing section 22 shown in FIG. 22. The top code and a provisional end-point state area output to the top-code correction section 23.

A code A/B counter 24 is reset by a one-bit reset signal. It outputs a code selection signal indicating a codeword to be selected between the two different codewords, that is, indicating the code A or the code B, which is to be selected, to the code-order reversing section 22 and to the top-code correction section 23.

The code-order reversing section 22 receives the (n−1)-bit codeword, which does not include the top code, from the start-point-fixed encoding section 21, generates a (n−1)-bit codeword, which does not include the top code, in that order when the code section signal sent from the code A/B counter 24 indicates the code B, and in the reverse order when the code selection signal indicates the code A, and outputs it to a latch 25.

The top-code correction section 23 generates a top code from the provisional end-point state and the provisional top code sent from the start-point-fixed encoding section 21 and the code selection signal sent from the code A/B counter 24, and outputs the top code to the latch 25.

Figure 8:
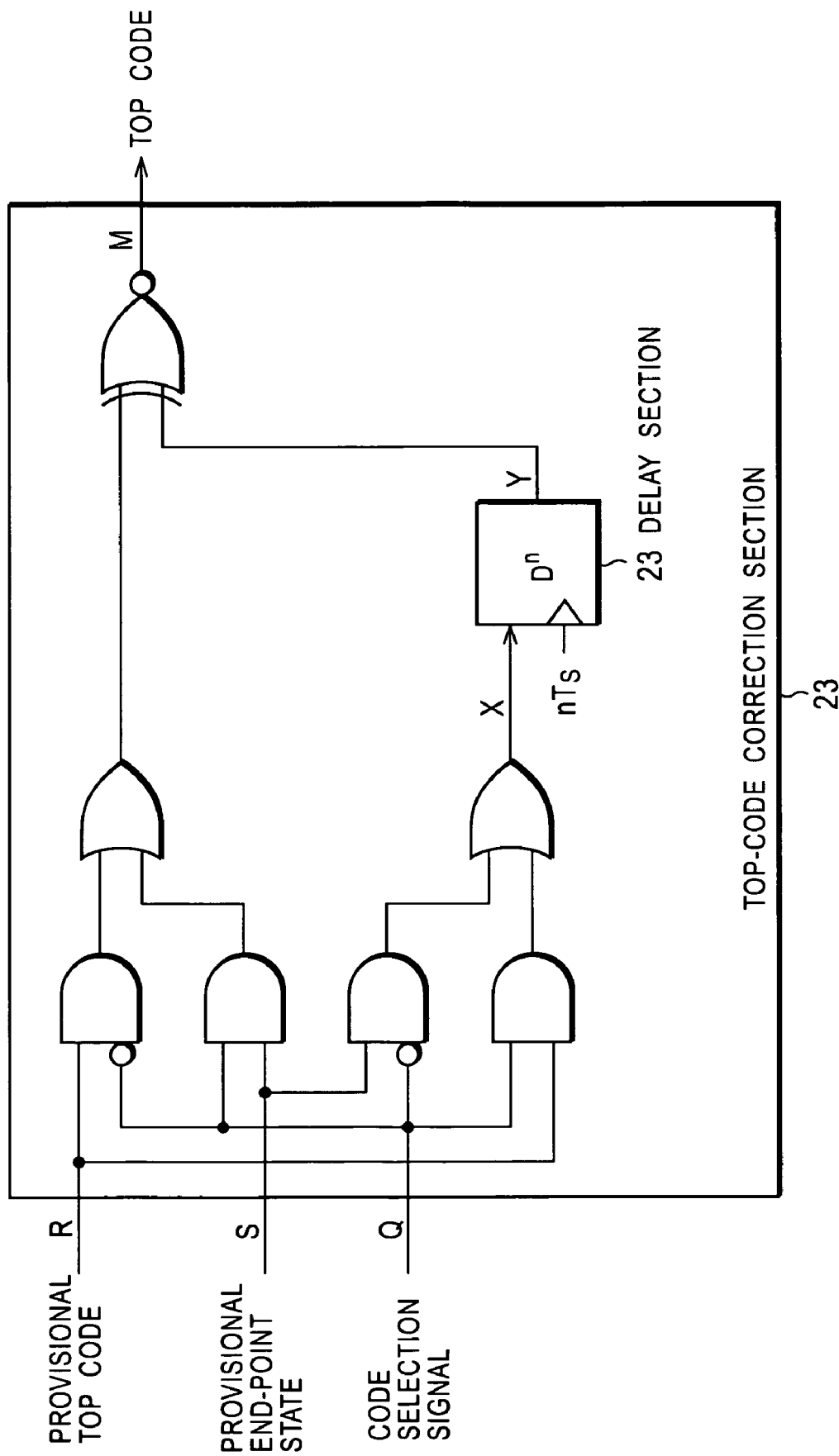
FIG. 8 is a block diagram showing a further detailed structure of a top-code correction section shown in FIG. 6.

FIG. 8 is a logic circuit diagram for describing a further detailed structure of the top-code correction section 23.

In the top-code correction section 23, a calculation to which the above-described rules 1 and 2 are applied is executed to correct and output the top code. It is possible to express the output M of the top-code correction section 23 by the Boolean operation shown by the following equations (1) and (2).

$$M = \sim \hat{Y} + (\sim QR + QS) \qquad (1)$$

$$X = QR + \sim QS \qquad (2)$$

In equations (1) and (2), R indicates the provisional top code input from the code A/B counter 24, and S and Q indicate the provisional end-point state and the code selection signal input from the first-point-fixed encoding section 21. IN addition, X indicates a signal input to a delay section 35 formed, for example, of a flip-flop, for delaying an input signal by one bit, that is, the end-point state of the code at the current time, and Y indicates the output of the delay section 35, that is, the end-point state of the code obtained by the previous encoding. In equations (1) and (2), a symbol, ~, indicates bit inversion.

The circuit scale of the top-code correction section 23 described by referring to FIG. 8 is about 30 gates. In other words, when the above-described rules 1 and 2 are applied, the top-code correction section 23, which has a very small circuit scale, is used to determine whether it is necessary to correct the top code and to correct the top code, if necessary, that is, to invert the top code.

The latch 25 synchronizes the top code sent from the top-code correction section 23 with the (n−1)-bit codeword, which does not include the top code, sent from the code-order reversing section 22 at a time interval of nTs, and outputs an n-bit parallel code to a parallel/serial conversion section 26.

The parallel/serial conversion section 26 converts the input n-bit parallel code to one-bit serial codes, and outputs as a recording code having a time interval of Ts.

The recording codes output from the encoding section 15, described by referring to FIG. 6, are converted to a recording rectangular wave by the D/A converter 2, and recorded into a recording medium not shown, by the recording and reproduction section 3.

Figure 9:
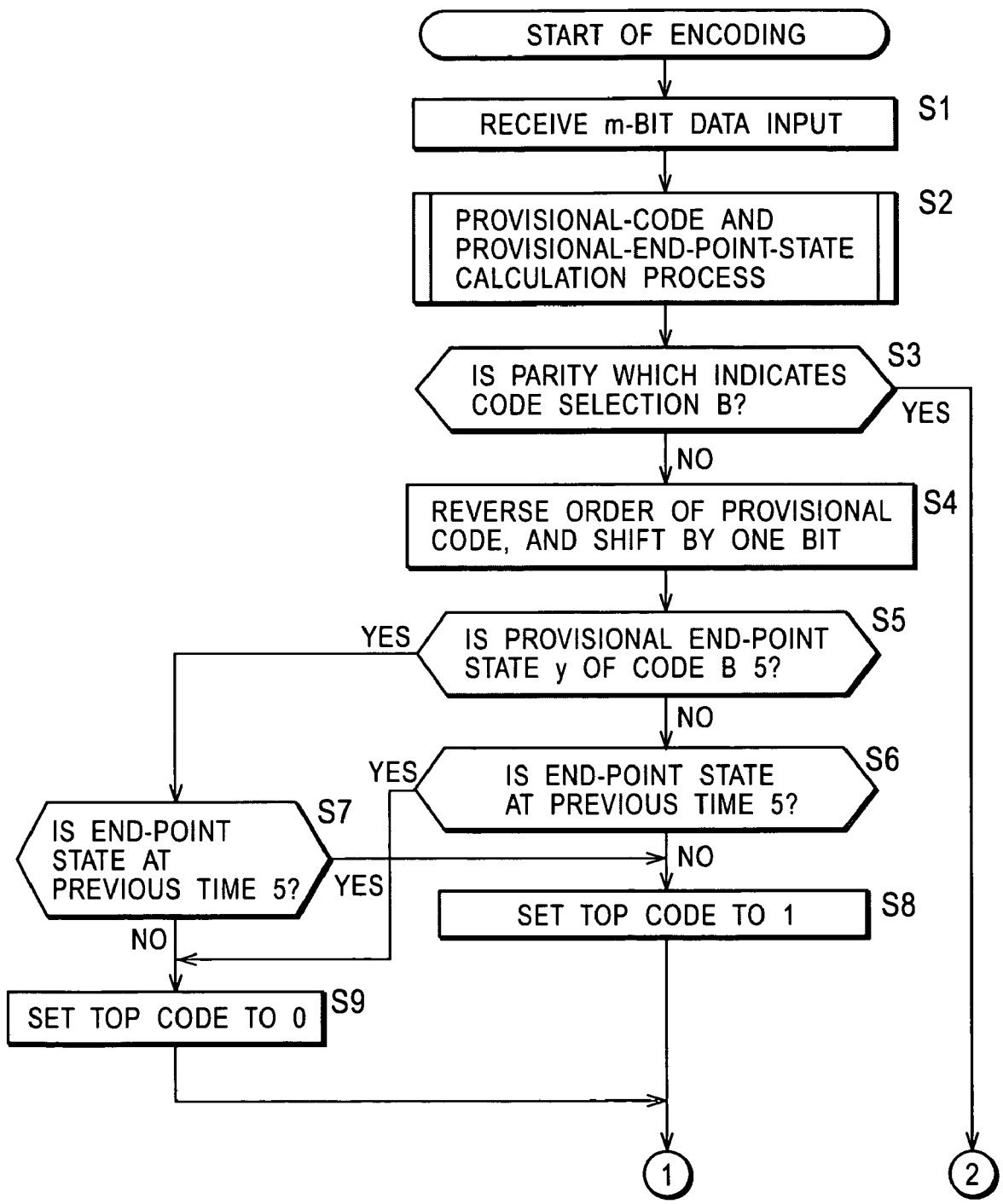
FIG. 9 is a flowchart used for describing encoding.
Figure 10:
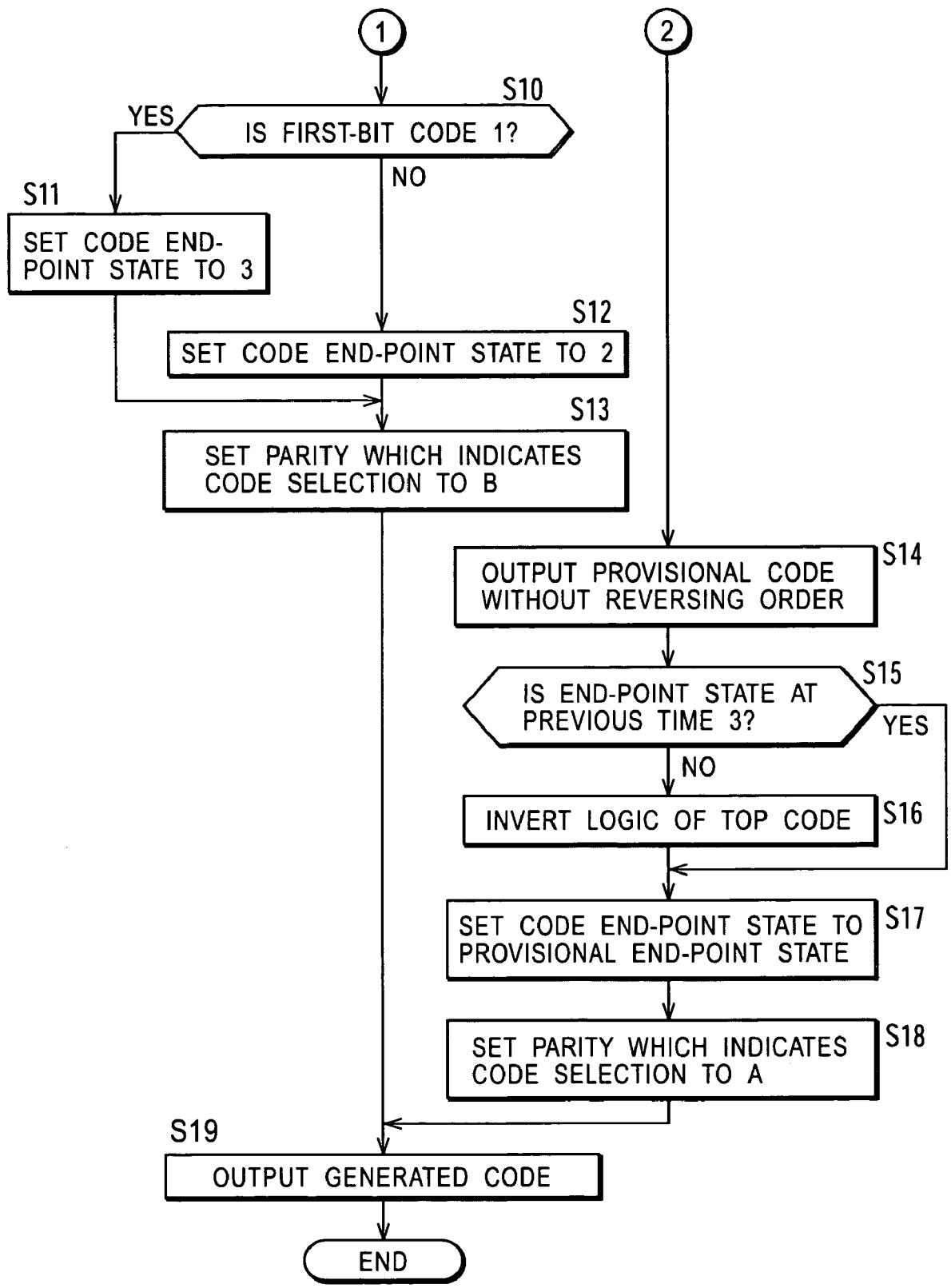
FIG. 10 is a flowchart used for describing encoding.

Encoding performed by the encoding section 15, which is described above and to which rules 1 and 2 are applied, will be described next by referring to a flowchart shown in FIG. 9 and FIG. 10.

In step S1, the start-point-fixed encoding section 21 receives an m-bit data input.

Figure 11:
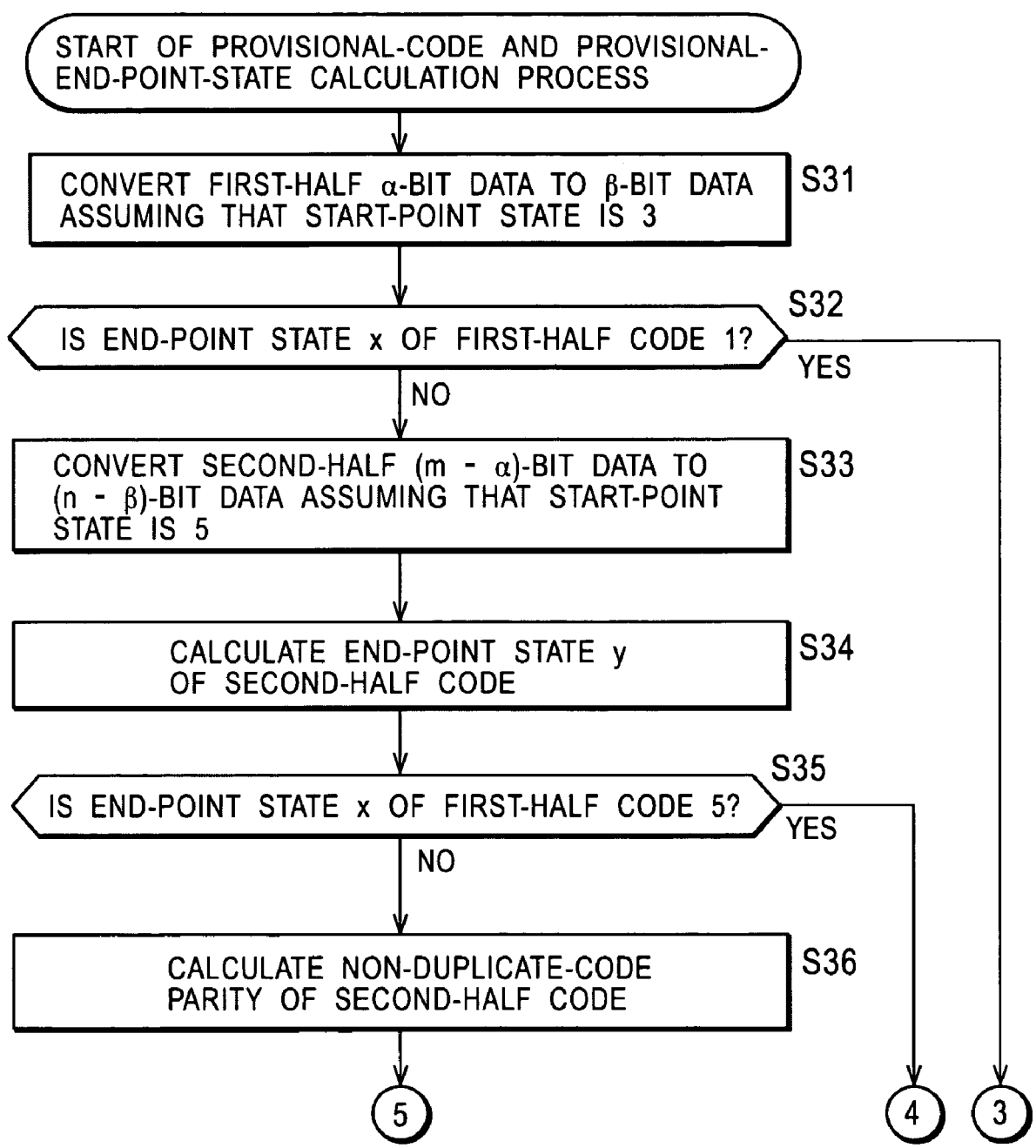
FIG. 11 is a flowchart used for describing a provisional-code and provisional-end-point-state calculation process.
Figure 12:
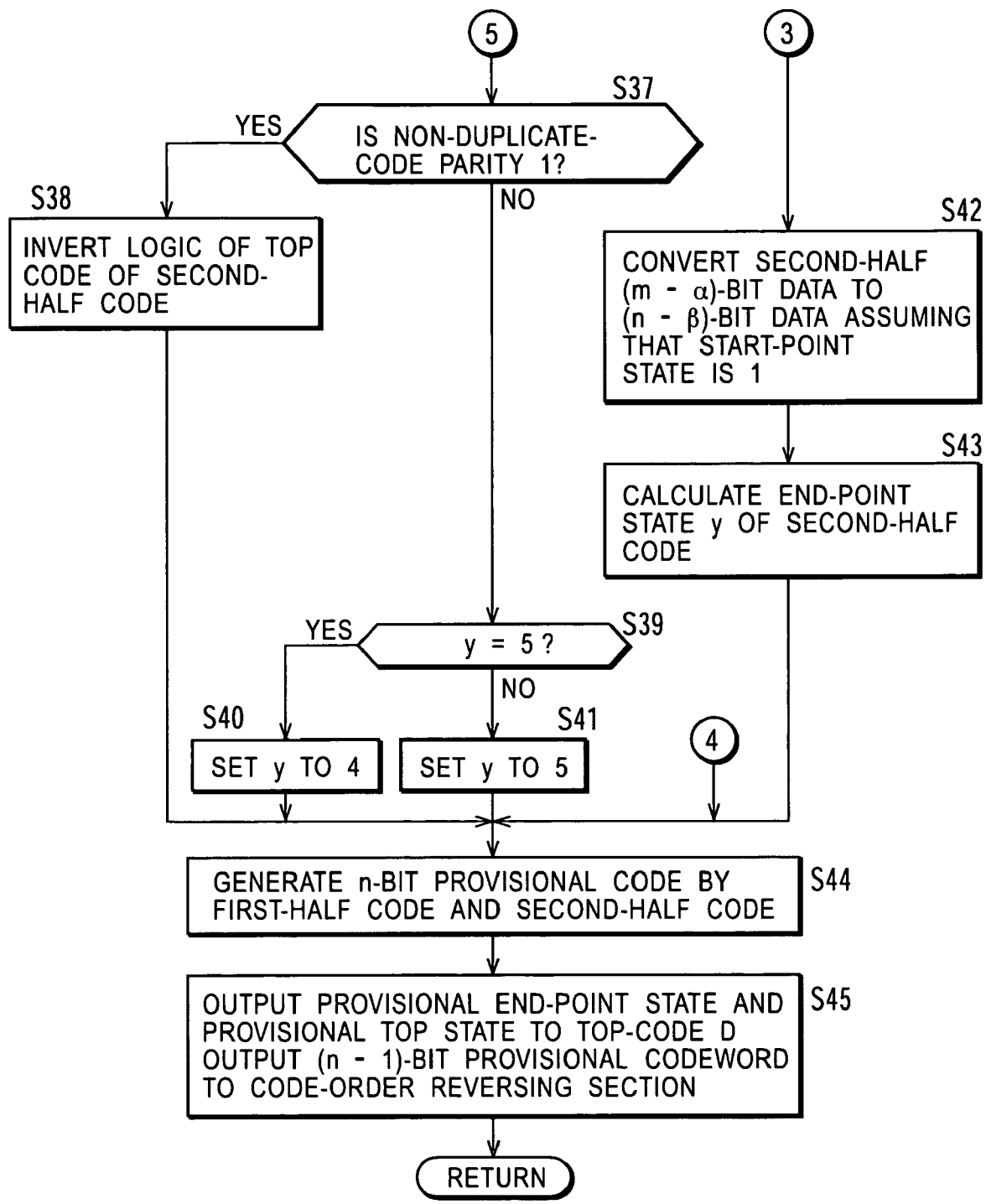
FIG. 12 is a flowchart used for describing a provisional-code and provisional-end-point-state calculation process.

In step S2, a provisional-code and provisional-end-point-state calculation process, described later by referring to FIG. 11 and FIG. 12, is executed.

In step S3, the code A/B counter 24 determines whether a parity indicating a code selection is B or not. When it is determined in step S3 that the parity indicating a code selection is B, the processing proceeds to step S14.

When it is determined in step S3 that the parity indicating a code selection is not B, that is, the parity is A, since the code A/B counter 24 outputs a code selection signal indicating the code A to the code-order reversing section 22 and to the top-code correction section 23, the code-order reversing section 22 reverses the order of the (n−1)-bit provisional code sent from the start-point-fixed encoding section 21, shifts the result by one bit, and outputs to the latch 25.

In step S5, the top-code correction section 23 determines whether the provisional end-point state "y" of the code B is 5 or not. The provisional end-point state "y" of the code B is 4 or 5.

When it is determined in step S5 that the provisional end-point state "y" of the code B is not 5, that is, the state is 4, the top-code correction section 23 determines in step S6 whether the end-point state at the previous time is 5 or not.

When it is determined in step S5 that the provisional end-point state "y" of the code B is 5, the top-code correction section 23 determines in step S7 whether the end-point state at the previous time is 5 or not. The end-point state at the previous time is 4 or 5.

When it is determined in step S6 that the end-point state at the previous time is not 5, that is, the state is 4, or when it is determined in step S7 that the end-point state at the previous time is 5, the top-code correction section 23 sets the top code to "1" in step S8.

When it is determined in step S6 that the end-point state at the previous time is 5, or when it is determined in step S7 that the end-point state at the previous time is not 5, that is, the state is 4, the top-code correction section 23 sets the top code to "0" in step S9.

After the process of step S8 or step S9 is finished, the top-code correction section 23 determines in step S10 whether the first-bit code, calculated in the provisional-code and provisional-end-point-state calculation process of step S2 and output from the start-point-fixed encoding section 21, that is, the top code, is "1" or not.

When it is determined in step S10 that the top code is "1", the top-code correction section 23 sets the end-point state of the code to 3 in step S11. The end-point state of the code is 2 or 3.

When it is determined in step S10 that the top code is not "1", the top-code correction section 23 sets the end-point state of the code to 2 in step S12.

After the process of step S11 or step S12 is finished, the code A/B counter 24 receives a reset-signal input and sets the parity indicating a code selection to B in step S13.

When it is determined in step S3 that the parity indicating a code selection is B, since the code A/B counter 24 outputs a code selection signal indicating the code B to the code-order reversing section 22 and to the top-code correction section 23, the code-order reversing section 22 output the (n−1)-bit provisional code sent from the start-point-fixed encoding section 21 without reversing its order to the latch 25.

In step S15, the top-code correction code 23 determines whether the end-point state at the previous time is 3 or not.

When it is determined in step S15 that the end-point state at the previous time is not 3, the top-code correction section 23 reverses the logic of the top code in step S16.

When it is determined in step S15 that the end-point state at the previous time is 3, or after the process of step S16 is finished, the top-code correction section 23 sets the end-point state of the code to the provisional end-point state calculated in the provisional-code and provisional-end-point-state calculation process of step S2.

In step S18, the code A/B counter 24 receives a reset-signal input, and sets the parity indicating a code selection signal to A.

In step S19, the latch 25 synchronizes the top code sent from the top-code correction section 23 with the (n−1)-bit codeword, which does not include the top code, sent from the code-order reversing section 22 at a time interval of nTs, and outputs an n-bit parallel code to the parallel/serial conversion section 26, where Ts indicates the clock time interval of the system. The parallel/serial conversion section 26 converts the input n-bit parallel code to one-bit serial codes, and outputs as a recording code having a time interval of Ts. The processing is finished.

The provisional-code and provisional-end-point-state calculation process executed in step S2 of FIG. 9 will be described next by referring to a flowchart shown in FIG. 11 and FIG. 12.

In step S31, the first-half encoding section 31 converts the α-bit input first-half data to a β-bit code assuming that the start-point state is 3, outputs the first-half code, and also outputs first-half-code end-point state information indicating the end-point state of the first-half code to the second-half encoding section 32. The end-point state of the first-half code is 1, 4, or 5. The first-half encoding section 31 may use any encoding method for encoding.

In step S32, the second-half encoding section 32 determines from the first-half-code end-point state information sent from the first-half encoding section 31 whether the end-point state "x" of the first-half code is "1" or not. When it is determined in step S32 that the end-point state "x" of the first-half code is "1", the process proceeds to step S42.

When it is determined in step S32 that the end-point state "x" of the first-half code is not "1", that is, it is determined that the state is 4 or 5, the second-half encoding section 32 converts the (m−α)-bit second-half data to an (n−β)-bit code assuming that the start-point state is 5, in step S33. The second-half encoding section 32 may use any encoding method for encoding.

In step S34, the second-half encoding section 32 calculates the end-point state "y" of the second-half code. The end-point state "y" of the second-half code is 4 or 5.

In step S35, the second-half encoding section 32 determines from the first-half-code end-point state information sent from the first-half encoding section 31 whether the end-point state "x" of the first-half code is "5" or not. When it is determined in step S35 that the end-point state "x" of the first-half code is "5", the process proceeds to step S44.

When it is determined in step S35 that the end-point state "x" of the first-half code is not "5", that is, it is determined that the state is 4, the second-half encoding section 32 calculates the non-duplicate code parity of the second-half code.

Two or more identical paths do not exist in the code B as a whole. However, identical paths exist for the second-half code only, and it is necessary to select one path. When the start point is set to state 4, the non-duplicate code parity is set to "0" for codes indicating state violation, and the non-duplicate code parity is set to "1" for codes which do not indicate state violation.

In step S37, the second-half encoding section 32 determines whether the non-duplicate code parity calculated in step S36 is "1".

When it is determined in step S37 that the non-duplicate code parity is not "1", that is, it is determined that the code does not violate the state restriction, the second-half encoding section 32 inverts the logic of the top code of the second-half code.

When it is determined in step S37 that the non-duplicate code parity is "1", that is, it is determined that the code violates the state restriction, since the second-half encoding section 32 needs to switch the value, 4 or 5, of the end-point state, the second-half encoding section 32 determines in step S39 whether the end-point state "y" of the second-half code calculated in step S34 is 5 or not.

When it is determined in step 39 that the end-point state "y" of the second-half code is 5, the second-half encoding section 32 sets the end-point state "y" of the second-half code to 4, in step S40.

When it is determined in step 39 that the end-point state "y" of the second-half code is not 5, that is, it is determined that the state is 4, the second-half encoding section 32 sets the end-point state "y" of the second-half code to 5, in step S41.

When it is determined in step S32 that the end-point state "x" of the first-half code is "1", the second-half encoding section 32 converts the (m−α)-bit second-half data to an (n−β)-bit code assuming that the start-point state is 1.

In step S43, the second-half encoding section 32 calculates the end-point state "y" of the second-half code. The end-point state "y" of the second-half code is 4 or 5.

When it is determined in step S35 that the end-point state "y" of the first-half code is 5, or after the process of step S38, S40, S41, or S43 is finished, an n-bit provisional code is generated in step S44 from the first-half code and the second-half code.

In step S45, the provisional top code included in the n-bit provisional code, and the provisional end-point state are output from the second-half encoding section 32 to the top-code correction section 23. The (n−1)-bit provisional code, which does not include the provisional top code, is output to the code-order reversing section 22. The process is returned to step S3 of FIG. 9.

With the processing described by referring to FIG. 9, FIG. 10, FIG. 11, and FIG. 12, to alternately encode two different block codes for every single codeword, provisional encoding is first performed according to a conversion rule for one block code only, and the top bit of the final codeword and the end-point state are determined from three pieces of information, the top code and the end-point state of the provisional codeword, and a selection signal for selecting one of the two block codes.

When a 24-bit data word shown in FIG. 13A is input to the start-point-fixed encoding section 21, for example, the start-point-fixed encoding section 21 encodes the 24-bit data word to generate a 27-bit provisional codeword shown in FIG. 13B, and outputs it except for its top bit to the code-order reversing section 22. According to the code selection signal input to the code-order reversing section 22 and to the top-code correction section 23, the code-order reversing section 22 determines whether the order of the input code is to be reversed, and the top-code correction section 23 determines whether the input provisional top code is to be corrected. The results are output to the latch 25.

Therefore, as shown in FIG. 13C, when the code selection signal indicates A, among the code output from the latch 25, the top bit is excluded, the order of the resultant 26-bit provisional codeword is reversed, and the top code sent from the top-code correction section 23 is added to generate a 27-bit code. When the code selection signal indicates B, the order of the 26-bit provisional codeword obtained by removing the top bit from the code output from the latch 25 is not reversed, and the top code sent from the top-code correction section 23 is added to generate a 27-bit code.

Decoding will be described next. A signal recorded in a recording medium not shown, read by the recording and reproduction section 3 is equalized by the analog equalizer 4 to have a predetermined target equalization characteristic, converted by the A/D converter 5 to a quantized a-bit digital equalized signal, and output to the code detector 6, and a code is detected, in the same way as described by referring to FIG. 1. The detected n-bit code is input to the decoding section 16.

The decoding section 16 first needs to convert the code A back to the code B, converse to the encoding section 15. However, if the decoding section 16 refers to information at the previous time, it causes the propagation of a series error. Therefore, unlike the encoding section 15, the decoding section 16 cannot refer to information at the previous time.

The decoding section 16 uses a third rule, rule 3, to decode a portion other than the top code. Rule 3 specifies that, when the top code is fixed to "0" or "1" in a trellis code from which QCS has been removed and in which NRZI is a prerequisite; the start-point state of the code is fixed to the state obtained in provisional encoding; and all-bit state inspection is executed, if the top code is erroneous, a state transition rule in encoding be always violated.

In other words, when the top code is fixed to "0" or "1" and all-bit state inspection is executed, if, as a result, the state transition rule in encoding is violated, the decoding section 16 inverts the top code to execute decoding. More specifically, the top bit of a detected code is not used in decoding.

Figure 14:
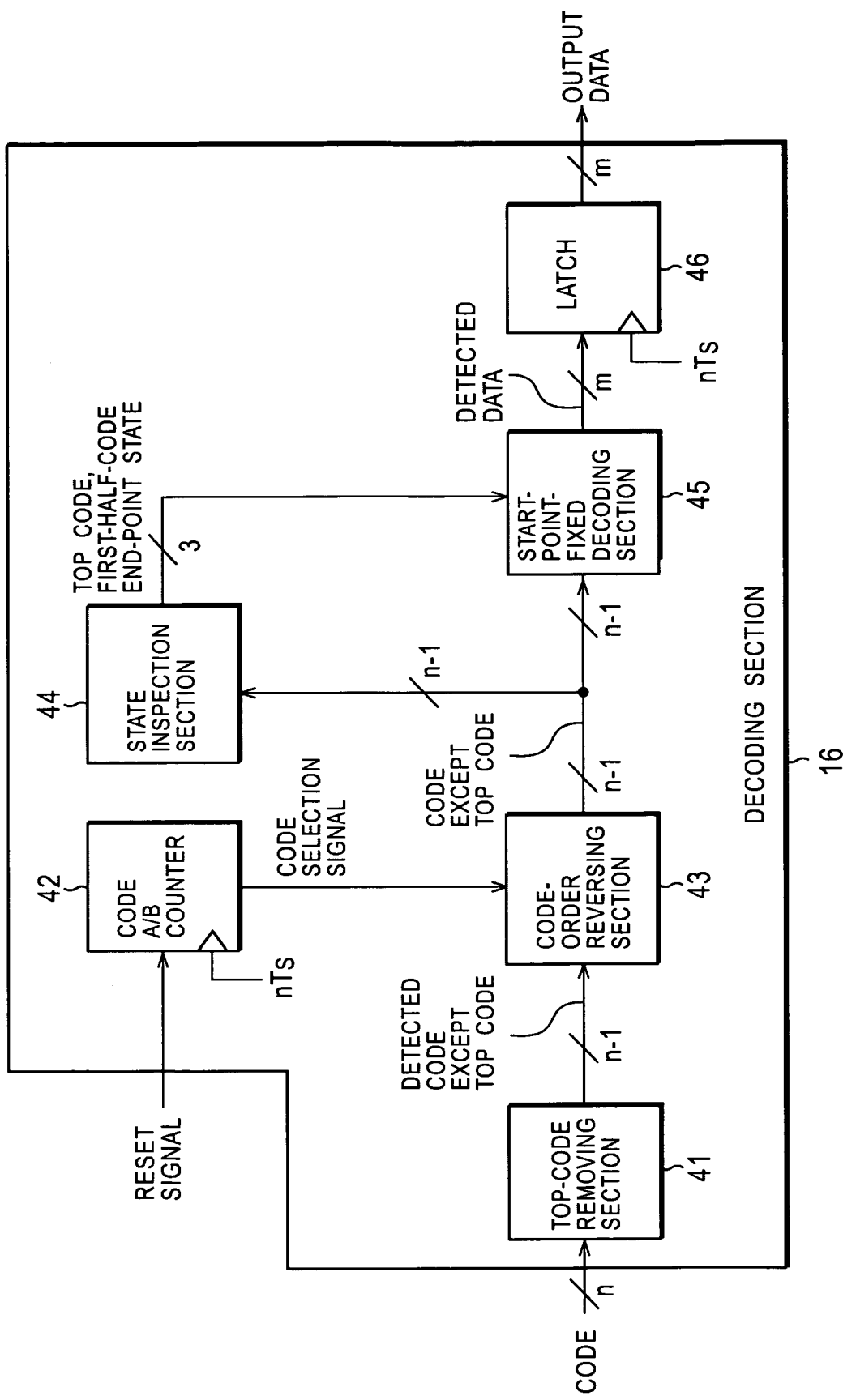
FIG. 14 is a block diagram showing a further detailed structure of a decoding section shown in FIG. 3.

FIG. 14 is a block diagram showing a further detailed structure of the decoding section 16.

A top-code removing section 41 removes the top code from an input n-bit code, and sends the (n−1)-bit detected code, which does not include the top code, to a code-order reversing section 43.

A code A/B counter 42 receives a one-bit reset-signal input, and outputs to the code-order reversing section 43 a code selection signal indicating a codeword to be selected among the two different codewords, that is, indicating that the code A is to be selected or the code B is to be selected.

The code-order reversing section 43 reverses the order of the (n−1)-bit detected code, which does not include the top code, sent from the top-code removing section 41 or passes the (n−1)-bit detected code as is, and outputs the code to a state inspection section 44 and to a start-point-fixed decoding section 45.

The state inspection section 44 adds the top code which is fixed to "1" or "0" to the input (n−1)-bit code, which does not include the top code, and performs state inspection. The state inspection section 44 estimates the correct top code according to the result of the state inspection, and outputs a one-bit top code and two-bit first-half-code end-point state information to the start-point-fixed decoding section 45.

When QCS is not removed from a trellis code input to the state inspection section 44, if the start-point state of the code is fixed to the state obtained in provisional encoding; the top code is fixed to "0" or "1"; and all-bit state inspection is executed, even if the top code is erroneous, a state transition rule in encoding is not always violated. Therefore, it is always required that QCS be removed from the code to be decoded by the decoding section 16.

Since the code B is converted and encoded to generate the code A, the top code of the code A does not include the information of the top code in provisional encoding at all. Consequently, to decode such a code, it is necessary to generate the top bit of an input code by state inspection.

The state inspection section 44 for executing state determination in this way can be formed of the state determination unit disclosed, for example, in Japanese Unexamined Patent Application Publication No. Hei-11-312984. The state determination unit includes logic circuits of about 150 gates.

The start-point-fixed decoding section 45 performs decoding according to the (n−1)-bit code, which does not include the top code, sent from the code-order reversing section 43, and the one-bit top code and the two-bit first-half-code end-point state information sent from the state inspection section 44, and outputs m-bit detected data to the latch 46. The latch 46 outputs the m-bit output data at a time interval of nTs.

Figure 15:
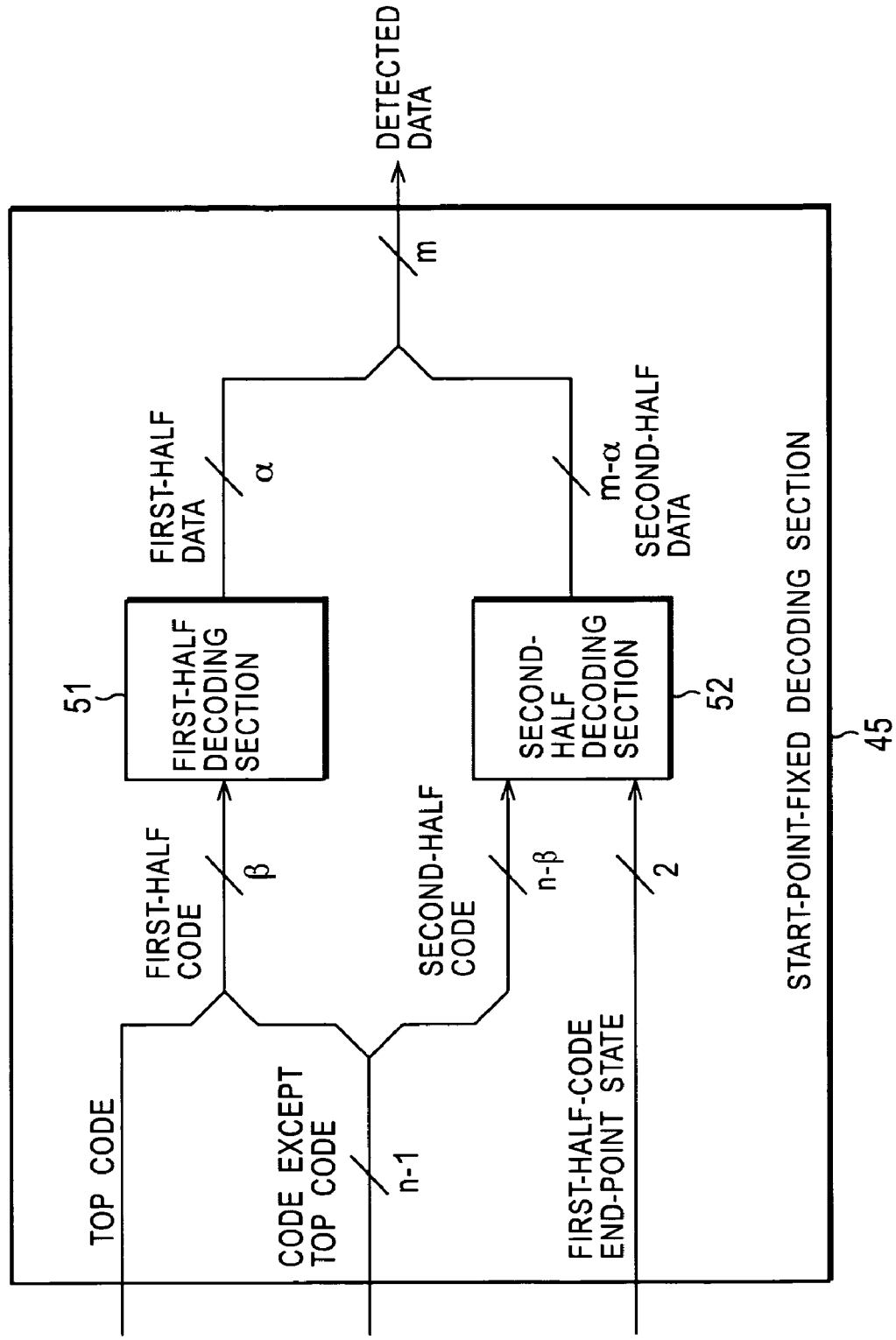
FIG. 15 is a block diagram showing a further detailed structure of a first-point-fixed decoding section shown in FIG. 14.

FIG. 15 is a block diagram showing a further detailed structure of the start-point-fixed decoding section 45.

A first-half decoding section 51 receives a code having a total of β bits, including the top code output from the state inspection section 44 and the first-half code of the (n−1)-bit code, which does not include the top code, output from the code-order reversing section 43, performs decoding, and outputs α-bit data.

A second-half decoding section 52 receives an (n−β)-bit second-half code of the (n−1)-bit code, which does not include the top code, output from the code-order reversing section 43, performs decoding, and outputs (m−α)-bit data.

The α-bit data output from the first-half decoding section 51 and the (m−α)-bit data output from the second-half decoding section 52 are sent to the latch 46 as m-bit detected data.

The first-half decoding section 51 and the second-half decoding section 52, shown in FIG. 15, may use any decoding method to execute decoding. For example, in the same way as in the first-half encoding section 31 and the second-half encoding section 32, described by referring to FIG. 7, when a circuit is formed so as to arrange codewords in the order of magnitude from the smallest or from the largest and to perform encoding by using the already-well-known enumerative source coding method, its circuit scale is about 2500 gates in the first-half decoding section 51 and the second-half decoding section 52 in total.

Decoding executed by the decoding section 16 will be described next by referring to a flowchart shown in FIG. 16.

Since the top-code removing section 41 removes the top bit from the input n-bit code, the code-order reversing section 43 receives the (n−1)-bit code, which does not include the top bit, from the top-code removing section 41, in step S61.

In step S62, the code A/B counter 42 determines whether the parity indicating a code selection is B or not.

When it is determined in step S62 that the parity indicting a code selection is not B, that is, it is determined that the code A is selected, the code A/B counter 42 outputs a code selection signal which selects the code A. In step S63, the code-order reversing section 43 reverses the code sent from the top-code removing section 41 and outputs the result.

In step S64, the code A/B counter 42 receives a reset-signal input, and sets the parity indicating a code selection to B.

When it is determined in step S62 that the parity indicting a code selection is B, the code A/B counter 42 outputs a code selection signal which selects the code B. In step S65, the code-order reversing section 43 outputs the code sent from the top-code removing section 41 without reversing it.

In step S66, the code A/B counter 42 receives a reset-signal input, and sets the parity indicating a code selection to A.

After the process of step S64 or step S66 is finished, the state inspection section 44 calculates the state violation parity of the code in step S67 assuming that the start-point state is 4. When a state violation is found, the state violation parity is set to "0". When a state violation is not found, the state violation parity is set to "1".

In step S68, the state inspection section 44 determines whether the state violation parity of the code is "1" or not.

When it is determined in step S68 that the state violation parity of the code is "1", the state inspection section 44 outputs a one-bit code "0" as the top code in step S69.

When it is determined in step S68 that the state violation parity of the code is not "1" but "0", the state inspection section 44 outputs a one-bit code "1" as the top code in step S70.

After the process of step S69 or step S70 is finished, the state inspection section 44 calculates the state of the β-th bit of the code, that is the final state "x" of the first-half code in step S71 assuming that the start-point state is 3.

Figure 17:
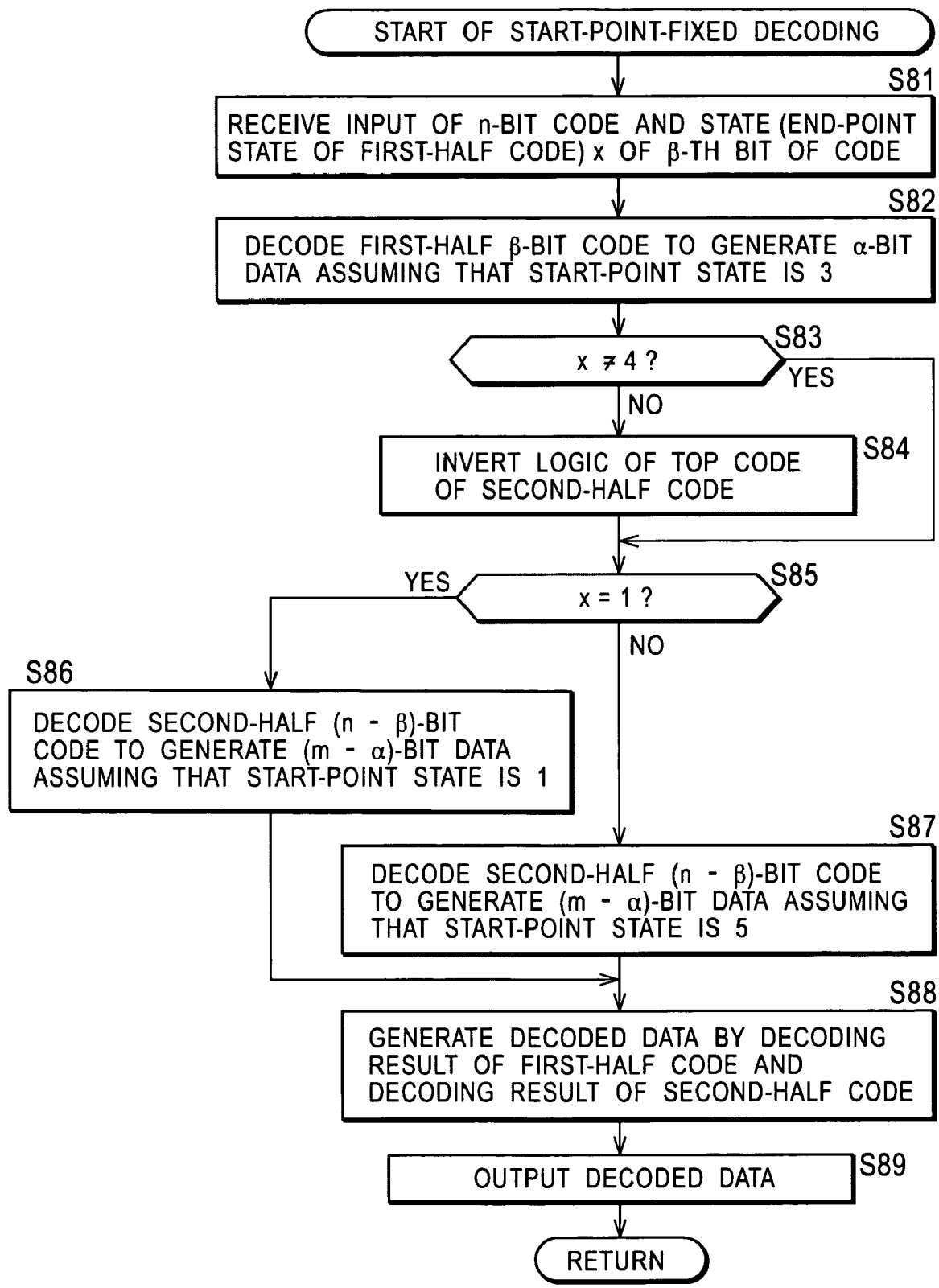
FIG. 17 is a flowchart used for describing first-point-fixed decoding.

In step S72, start-point-fixed decoding described later by referring to FIG. 17 is executed.

In step S73, the first-point-fixed decoding section 45 outputs a decoded m-bit data to the latch 46, and the latch 46 synchronizes the m-bit data at a time interval of nTs, and outputs it. The processing is finished. Ts indicates the clock time interval of the system.

The start-point-fixed decoding executed in step S72 of FIG. 16 will be described next by referring to FIG. 17.

In step S81, the first-point-fixed decoding section 45 receives a code having n bits in total, including the top code output from the state inspection section 44 and the code output from the code-order reversing section 43, which does not include the top code, and the β-th bit output from the state inspection section 44, that is, the code state "x" of the end-point state of the first-half code. Among the input n-bit code, the first-half β-bit code is input to the first-half decoding section 51, and the second-half (n−β)-bit second-half code and the end-point state of the first-half code are input to the second-half decoding section 52. The end-point state "x" of the first-half code is 1, 4, or 5.

In step S82, the first-half decoding section 51 decodes the first-half β bits to generate α-bit data with the start-point state being set to 3. The first-half decoding section 51 may use any decoding method for decoding.

In step S83, the second-half decoding section 52 determines whether the input end-point state "x" of the first-half code is not 4.

When it is not determined in step S83 that the end-point state "x" of the first-half code is not 4, the second-half decoding section 52 inverts the logic of the top code of the second-half code in step S84.

When it is determined in step S83 that the end-point state "x" of the first-half code is not 4, or after the process of step S84 is finished, the second-half decoding section 52 determines in step S85 whether the end-point state "x" of the first-half code is 1.

When it is determined in step S85 that x is 1, the second-half decoding section 52 decodes the second-half (n−β)-bit code to generate (m−α)-bit data with the start-point state being set to 1, in step S86.

When it is determined in step S85 that x is not 1, the second-half decoding section 52 decodes the second-half (n−β)-bit code to generate (m−α)-bit data with the start-point state being set to 5, in step S87.

In step S86 and step S87, the second-half decoding section 52 may use any decoding method for decoding.

After the process of step S86 or step S87 is finished, decoded data is generated in step S88 from the decoding result for the first-half code, output from the first-half decoding section 51, and the decoding result for the second-half code, output from the second-half decoding section 52. In step S89, the generated m-bit decoded data is output, and the processing is returned to step S73 of FIG. 16.

Figure 16:
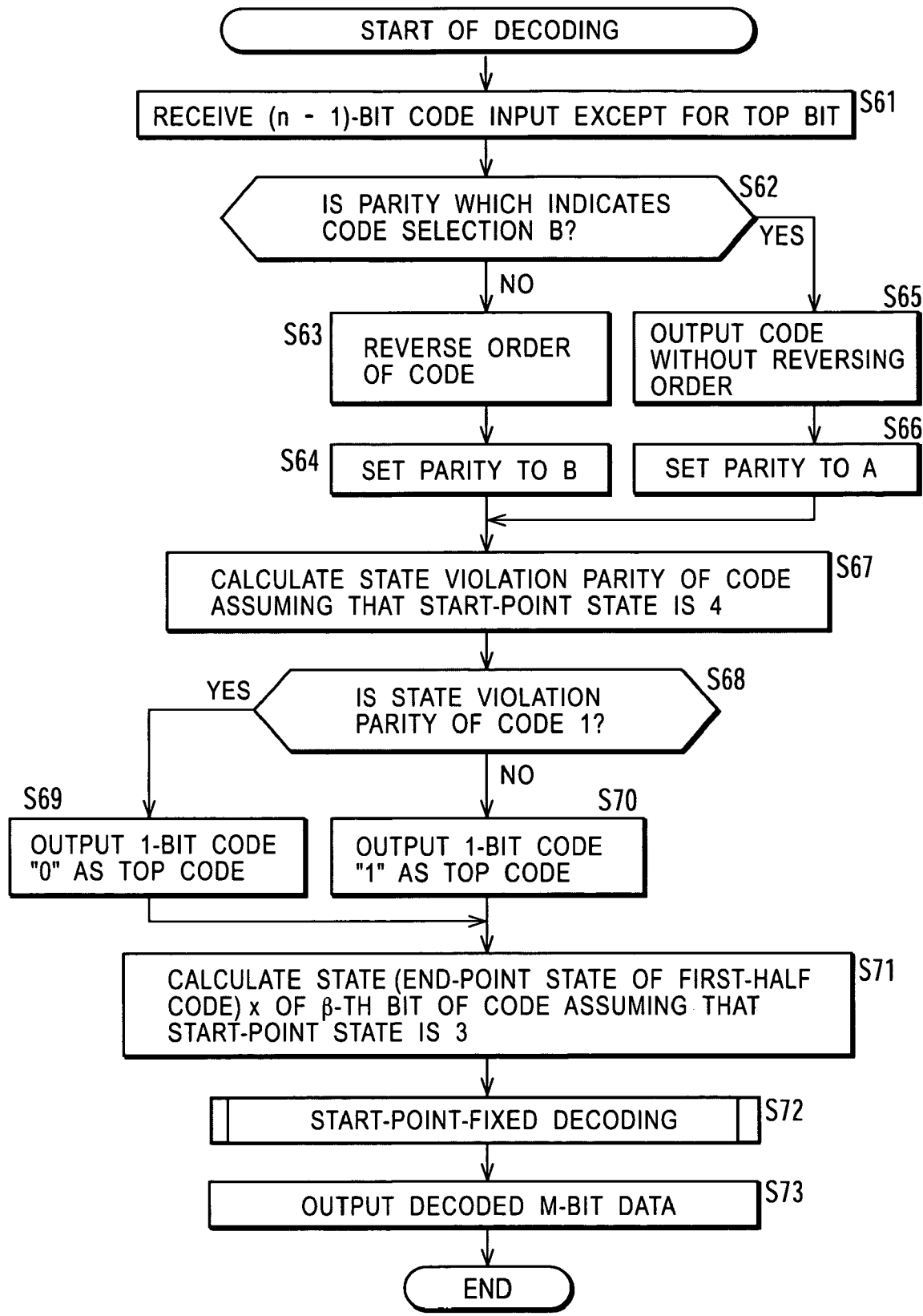
FIG. 16 is a flowchart used for describing decoding.

With the processing described by referring to FIG. 16 and FIG. 17, to alternately decode two different block codes for every single codeword, the state inspection of a code which does not include the top code is performed to estimate the top code, and decoding is executed, without using the top code detected by the code detector 6. A code division method is used in decoding. More specifically, the end-point state of the first-half code obtained by division is detected, and the second-half code obtained by division is decoded according to the result of detection.

When a 26-bit codeword shown in FIG. 18A, a codeword which does not include the top code, is input to the code-order reversing section 43, for example, the code-order reversing section 43 reverses the order of the corresponding 26-bit codeword and outputs the result to the first-point-fixed decoding section 45 when the code selection signal indicates A, and outputs the corresponding 26-bit codeword to the first-point-fixed decoding section 45 without reversing it when the code selection signal indicates B.

In addition, the first-point-fixed decoding section 45 further receives a one-bit top code from the state inspection section 44. Therefore, the first-point-fixed decoding section 45 receives a 27-bit codeword shown in FIG. 18B. Then, the first-point-fixed decoding section 45 decodes the input codeword according to the above-described processing to generate a 24-bit data shown in FIG. 18C, and outputs it.

Further, with rule 3, which is used in the above-described decoding, being applied, encoding can be performed. Rule 3 specifies that, when the top code is fixed to "0" or "1" in a trellis code from which QCS has been removed and in which NRZI is a prerequisite; the start-point state of the code is fixed to the state obtained in provisional encoding; and all-bit state inspection is executed, if the top code is erroneous, a state transition rule in encoding be always violated.

Figure 19:
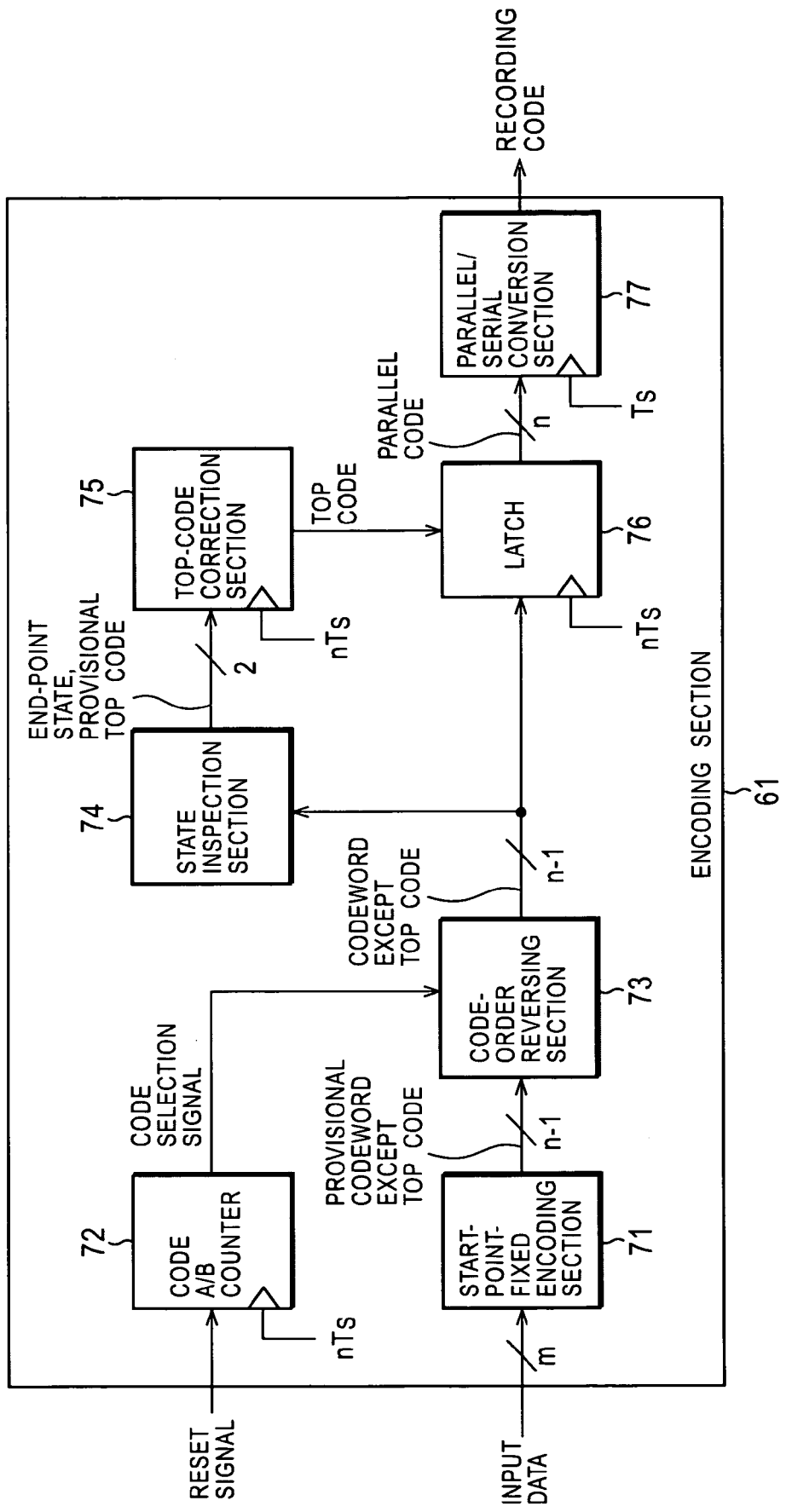
FIG. 19 is a block diagram showing the structure of an encoding section having the structure different from that shown in FIG. 6.

FIG. 19 is a block diagram showing the structure of a encoding section 61 to which rule 3 is applied. The encoding section 61 can be used instead of the encoding section 15 shown in FIG. 2.

A start-point-fixed encoding section 71 encodes input m-bit data to generate an (n−1)-bit provisional codeword which does not include a top code, and outputs it to a code-order reversing section 73, in the same way as the start-point-fixed encoding section 21, described by referring to FIG. 6.

A code A/B counter 72 outputs a code selection signal switched by a reset signal to the code-order reversing section 73, in the same way as the code A/B counter 24, described by referring to FIG. 6.

In the same way as the code-order reversing section 22, described by referring to FIG. 6, according to the code selection signal sent from the code A/B counter 72, the code-order reversing section 73 reverses the order of the (n−1)-bit provisional codeword, which does not include a top code, sent from the start-code-fixed encoding section 71 and outputs the result, or outputs the provisional codeword without reversing its order, to a state inspection section 74 and to a latch 76.

The state inspection section 74 adds the top code fixed to "1" or "0" to the input (n−1)-bit code, which does not include the top code; executes state inspection; uses the result of inspection to estimate a correct top code; and outputs a one-bit provisional top code and one-bit first-half-code end-point state information to a top-code correction section 75, in the same way as the state inspection section 44, described by referring to FIG. 6.

Figure 20:
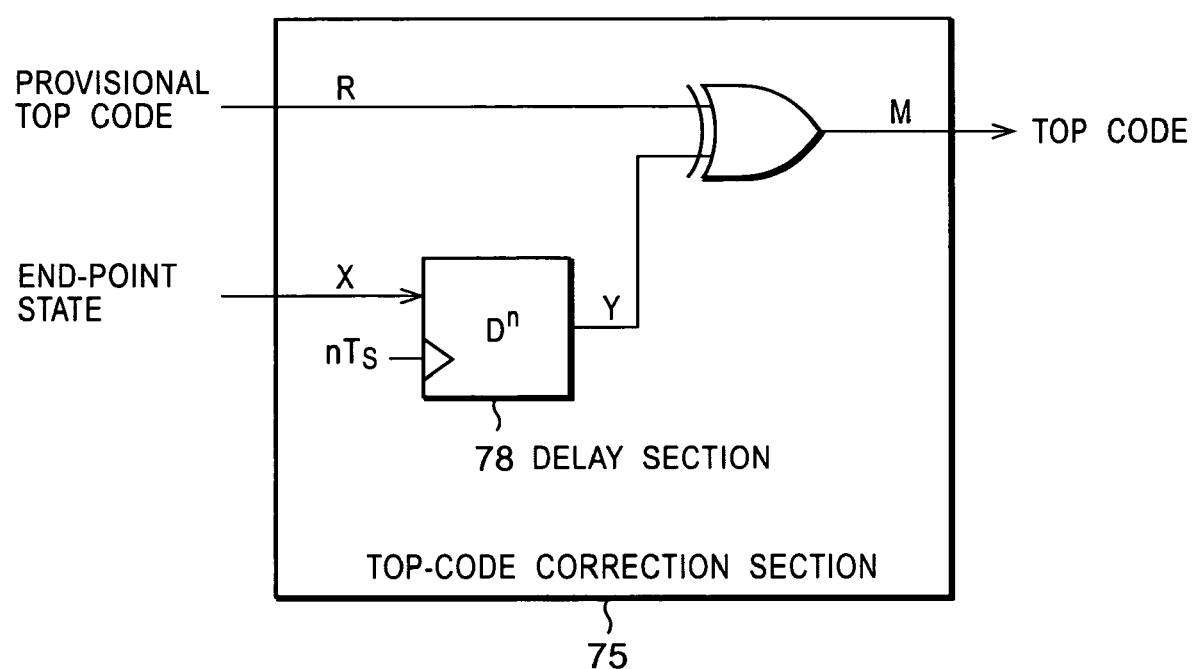
FIG. 20 is a block diagram showing a further detailed structure of a top-code correction section shown in FIG. 19.

The top-code correction section 75 detects the top code according to the end-point state and the provisional top code sent from the state inspection section 74, and outputs the top code to the latch 76. FIG. 20 is a logic circuit diagram showing a further detailed structure of the top-code correction section 75.

The output M of the top-code correction section 75 can be expressed by Boolean operation shown in the following equation (3).

$$M = R \hat{+} Y \tag{3}$$

In equation (3), R indicates the provisional top code sent from the state inspection section 74. As shown in FIG. 20, the end-point state "X" sent from the state inspection section 74 is input, as the end-point state of the code at the current time, to a delay section 78 formed, for example, of a flip-flop, for delaying an input signal by one bit. Y indicates the output of the delay section 78, that is, the end-point state of the code encoded at the previous time.

The latch 76 receives the (n−1)-bit provisional codeword, which does not include the top code, from the code-order reversing section 73, and further receives the top code from the top-code correction section 75, which means a code having n bits in total is received. The latch 76 synchronizes the input code at a time interval of nTs, and outputs as an n-bit parallel code to a parallel/serial conversion section 77.

The parallel/serial conversion section 77 converts the input n-bit parallel code to one-bit serial codes, and outputs as recording codes at a time interval of Ts.

In the encoding section 62, described by referring to FIG. 19, to alternately encode two different block codes for every single codeword, provisional encoding and order reversing are first applied to codewords which do not include the top code, according to a conversion rule for one block code only, and the state inspection of provisional codes which do not include the top code is executed to determine the top code. Synchronization and serial conversion are applied to the resultant codes to output them as recording codes.

When identical data is input to the encoding section 61, described by referring to FIG. 19, and to the encoding section 15, described by referring to FIG. 6, both encoding sections output the same recording codes.

When the above-described encoding and decoding are unperformed, it is very difficult for encoding apparatuses and decoding apparatuses for an alternate-conversion trellis code to use only one type of substantial conversion rule. As comparison examples, an encoding apparatus and a decoding apparatus for an alternate-conversion trellis code to which the present invention is not adapted will be described.

Figure 21:
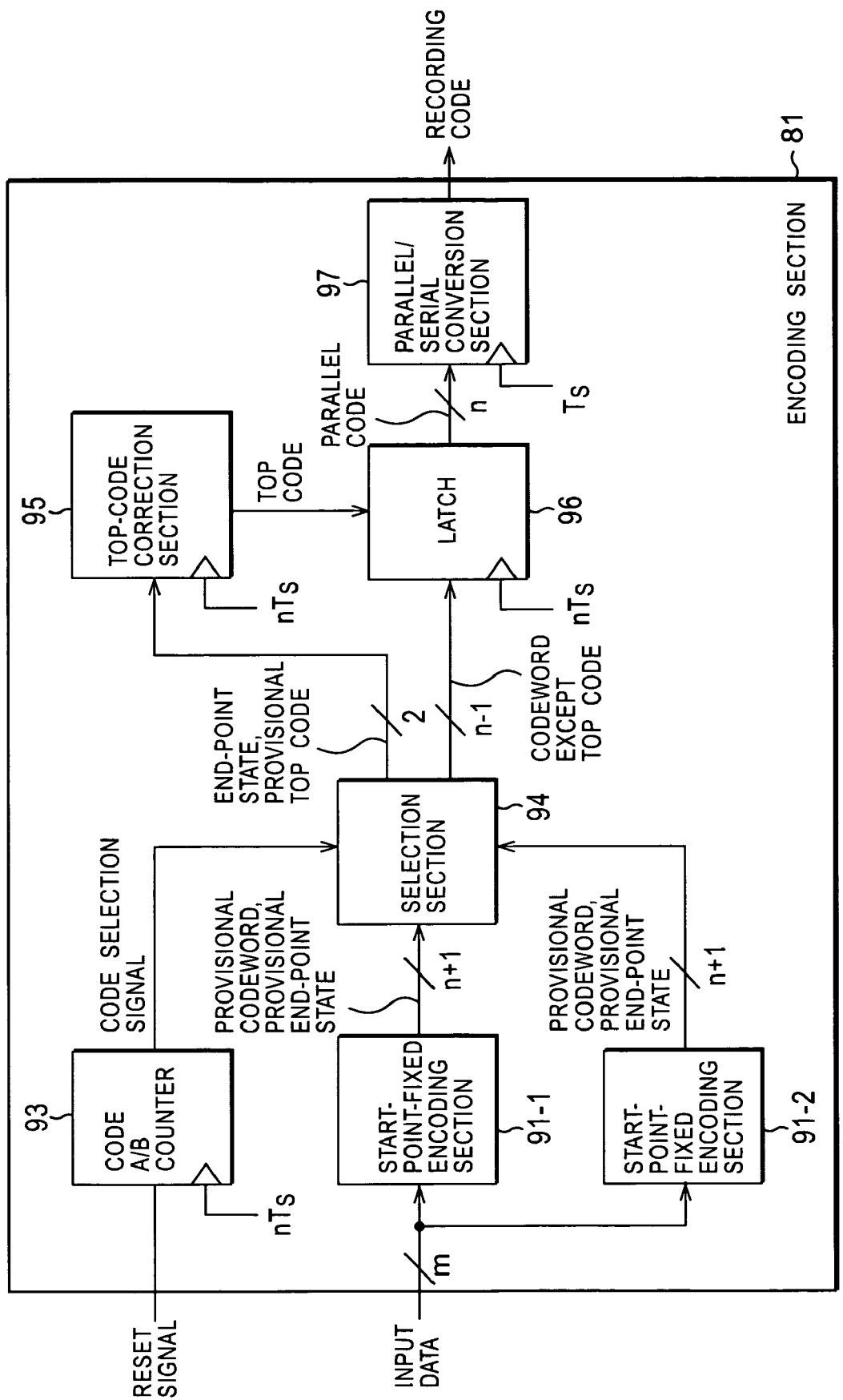
FIG. 21 is a block diagram showing the structure of an encoding section used as a comparison example.

FIG. 21 is a block diagram showing an example structure of an encoding section 81 which is used in a comparison example instead of the encoding section 15, described by referring to FIG. 6.

Input m-bit data is input to start-point-fixed encoding sections 91-1 and 91-2. The start-point-fixed encoding sections 91-1 and 91-2 encode the input data according to different conversion rules, and each output an n-bit provisional codeword in which the start-point state of the code is fixed, and a one-bit provisional end-point state to a selection section 94. A code A/B counter 93 outputs a code section signal switched according to a reset signal to the selection section 94, in the same way as the code A/B counter 24, described by referring to FIG. 6.

The selection section 94 selects one of two sets of the n-bit provisional codewords and the one-bit provisional end-point states sent from the start-point-fixed encoding sections 91-1 and 91-2, according to the code selection signal sent from the code A/B counter 93, and outputs an (n−1)-bit codeword which does not include the top code to the latch 96, and an end-point state and the provisional top code to the top-code correction section 95.

The top-code correction section 95 estimates a top code from the input end-point state and provisional top code, and outputs the top code to the latch 96. The latch 96 receives the (n−1)-bit codeword, which does not include the top code, from the selection section 94, and receives the top code from the top-code correction section 95, which means that a code having n bits in total is received, synchronizes the code at a time interval of nTs, and outputs as an n-bit parallel code to a parallel/serial conversion section 97.

The parallel/serial conversion section 97 converts the input n-bit parallel code to one-bit serial codes, and outputs as recording codes having a time interval of Ts to the D/A converter 2, in the same way as the parallel/serial conversion section 26, described by referring to FIG. 6.

The encoding section 81, described by referring to FIG. 21, needs two start-point-fixed encoding sections, the start-point-fixed encoding sections 91-1 and 91-2. Therefore, the encoding section 81, described by referring to FIG. 21, has about twice the circuit scale of the encoding section 15, described by referring to FIG. 6, even though the code division method is not used.

Since the code A cannot be divided, unlike the code B, the encoding section 81, which requires a start-point-fixed encoding section for the code A and which has been described by referring to FIG. 21, is about $(2^m+2^\alpha+2^{m-\alpha})/(2^\alpha+2^{m-\alpha})$ times, that is, 2049 times if m=24 and α=12, as complicated as in a case in which the code division method is used as in the present embodiment.

Figure 22:
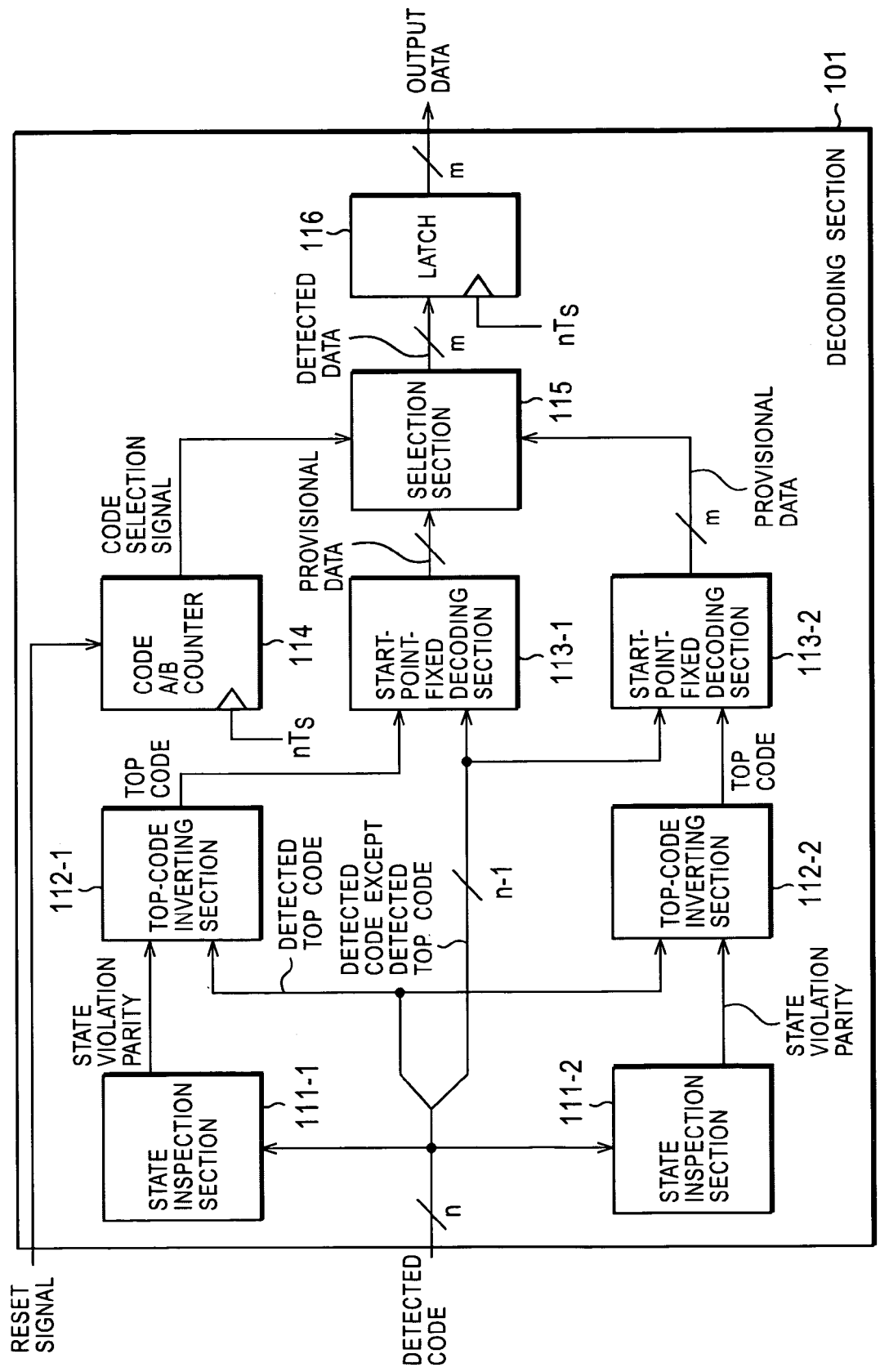
FIG. 22 is a block diagram showing the structure of a decoding section used as a comparison example.

FIG. 22 is a block diagram showing an example structure of a decoding section 101 used in a comparison example instead of the decoding section 16, described by referring to FIG. 14.

An input n-bit decoded code is sent to state inspection sections 111-1 and 111-2, the top detected code thereof is sent to top-code inverting sections 112-1 and 112-2, and the (n−1)-bit detected code which does not include the top detected code is sent to start-point-fixed decoding sections 113-1 and 113-2.

Since there are two start-point states for encoding, the state inspection sections 111-1 and 111-2 apply state inspection to the detected code separately input, and generates one-bit state violation parities indicating whether an encoding rule is violated or not, correspondingly to the two start-point states; and the state inspection section 111-1 sends the parity to the top-code inverting section 112-1, and the state inspection section 111-2 sends the parity to the top-code inverting section 112-2.

According to the input state violation parities, the top-code inverting sections 112-1 and 112-2 invert the input top detected code when state violation is found, and do not invert the input top detected code when state violation is not found. The top-code inverting section 112-1 outputs the top code modified if necessary to the start-point-fixed decoding section 113-1, and the top-code inverting section 112-2 outputs the top code modified if necessary to the start-point-fixed decoding section 113-2.

The start-point-fixed decoding sections 113-1 and 113-2 receive codes having n bits in total, the top codes and the (n−1)-bit detected codes, which do not include the top detected code, performs decoding, and outputs m-bit provisional data to a selection section 115.

A code A/B counter 114 outputs a code selection signal switched according to a reset signal to the section 115, in the same way as the code A/B counter 42, described by referring to FIG. 14.

The selection section 115 selects one of the m-bit provisional data sent from the start-point-fixed decoding sections 113-1 and 113-2, according to the code selection signal sent from the code A/B counter 114, and outputs the result to a latch 116. The latch 116 outputs the m-bit output data at a time interval of nTs, in the same way as the latch 46, described by referring to FIG. 14.

The decoding section 101, described by referring to FIG. 22, needs two start-point-fixed decoding sections, the start-point-fixed encoding sections 113-1 and 113-2 because there are two start-point states in encoding. Therefore, the decoding section 101, described by referring to FIG. 22, has about twice the circuit scale of the decoding section 16, described by referring to FIG. 14, even though the code division method is not used.

Since the code A cannot be divided, unlike the code B, the encoding section 101, described by referring to FIG. 22, is about 2049 times, if m=24 and α=12, as complicated as in a case in which the code division method is used as in the present embodiment, in the same way as the encoding section 81, described by referring to FIG. 21.

As described above, when the present invention in which encoding is performed by using a substantially one-type encoding section, and further, decoding is performed by using a substantially one-type decoding section is applied to a trellis code, in which two different block codes are alternately encoded for every single codeword, an encoding apparatus and a decoding apparatus having small circuit sizes are implemented for a trellis code having a high encoding rate.

It is also possible to perform the same processing with NRZ modulation being used as a prerequisite. In this case, it is necessary to control the polarities of codes in encoding performed by the encoding section 15 or the encoding section 61, and in decoding performed by the decoding section 16.

The series of above-described processing can also be executed by software. A program constituting the software is installed from a recording medium to a computer built in special hardware or to a unit, such as, a general-purpose personal computer, which executes various functions when various programs are installed.

As shown in FIG. 23, the recording media includes package media which are distributed separately from the computer to the users for providing programs and which store the programs, such as a magnetic disk 141, an optical disk 142, a magneto-optical disk 143, and a semiconductor memory 144. The magnetic disk 141 includes a flexible disk, the optical disk 142 includes a CD-ROM (compact disc-read only memory) and a DVD (digital versatile disk), and the magneto-optical disk 143 includes an MD (Mini-Disk) (trademark).

A personal computer 121 will be described by referring to FIG. 23.

A CPU (central processing unit) 131 receives the signals corresponding to various instructions which the user inputs by using an input section 134, through an input-and-output interface 132 and an internal bus 133, and also receives a control signal sent from another personal computer, through a network interface 140, and executes various processes according to input signals. A ROM (read-only memory) 135 stores basically fixed data used in the programs and calculation parameters which the CPU 131 uses. A RAM (random-access memory) 136 stores programs used by the CPU 131 and parameters which change as required during the execution of the programs. The CPU 131, the ROM 125, and the RAM 136 are connected to each other by the internal bus 133.

The internal bus 133 is also connected to the input-and-output interface 132. The input section 134 is formed, for example, of a keyboard, a touch sensitive pad, a jog dial, or a mouse, and is operated when the user inputs various instructions to the CPU 131. A display section 137 is formed, for example, of a CRT (cathode ray tube) and a liquid-crystal display apparatus, and displays various types of information by text or by images.

A HDD (hard disk drive) 138 drives hard disks, and records or reproduces a program to be executed by the CPU 131 and information into or from the hard disks. A drive 139 reads and writes data into and from the magnetic disk 141, the optical disk 142, the magneto-optical disk 143, or the semiconductor memory 144 loaded, as required.

The network interface 140 is connected to other personal computers and to various apparatuses other than personal computers by wire with predetermined cables or by radio; sends and receives information to and from those units; and accesses a web server through the Internet to send and receive information.

The input section 134 to the network interface 140 are connected to the CPU 131 through the input-and-output interface 132 and the internal bus 133.

In the present specification, steps describing the programs stored in a recording medium include not only processes executed in a time-sequential manner in the described order, but also those not necessarily executed in a time-sequential manner but executed in parallel or independently.

INDUSTRIAL APPLICABILITY

According to an encoding method, an encoding apparatus, and a program according to a first aspect of the present invention, a substantially one-type encoding section is used to execute encoding for a trellis code, in which two different block codes are alternately encoded for every single codeword, and the encoding apparatus for a trellis code having a high encoding rate has a small circuit size.

According to an encoding method, an encoding apparatus, and a program according to a second aspect of the present invention, a substantially one-type encoding section is used to execute encoding for a trellis code, in which two different block codes are alternately encoded for every single codeword, and the encoding apparatus for a trellis code having a high encoding rate has a small circuit size.

According to a decoding method and a decoding apparatus of the present invention, and a program according to a third aspect of the present invention, a substantially one-type decoding section is used to execute decoding for a trellis code, in which two different block codes are alternately encoded for every single codeword, and the decoding apparatus for a trellis code having a high encoding rate has a small circuit size.

The invention claimed is:

1. An encoding method for alternately encoding two different block codes for every single codeword, in which one code has a reversed order against a part of the other code, the codeword being stored in a recording apparatus and accessible via a data processor, the method comprising:
    a provisional-encoding step of using a conversion rule of a first block code to perform provisional encoding;
    a selection step of outputting a selection signal which selects the first block code or a second block code having a reversed order to that of the first block code; and
    a first bit determination step of determining the first bit of a final codeword according to the first bit value and the end-point state of a provisional codeword obtained by the process of the provisional-encoding step and the selection signal output by the process of the selection step.

2. An encoding method according to claim 1, further comprising:
    an end-point-state determination step of determining the end-point state of the final codeword according to the first bit value and the end-point state of the provisional codeword obtained by the process of the provisional-encoding step and the selection signal output by the process of the selection step.

3. An encoding method according to claim 1, wherein in the process of the provisional-encoding step, a code division method is used to execute provisional encoding, and the final codeword is determined after provisional encoding is finished for all division codes of the codes.

4. An encoding method according to claim 1, wherein the maximum run length of the first block code or the second block code is limited to a finite value.

5. An encoding method according to claim 1, wherein the amplitude of the accumulated charge of the first block code or the second block code is limited to a finite value.

6. An encoding method according to claim 1, wherein the first block code or the second block code has two different states.

7. An encoding apparatus for alternately encoding two different block codes for every single codeword, in which one code has a reversed order against a part of the other code, the apparatus comprising:
a provisional-encoding section for using a conversion rule of a first block code to perform provisional encoding;
a selection-signal output section for outputting a selection signal which selects the first block code or a second block code having reversed order to that of the first block code; and
a first bit determination section for determining the first bit of a final codeword according to the first bit value and the end-point state of a provisional codeword obtained by the provisional-encoding section and the selection signal output from the selection-signal output section.

8. A recording medium having recorded therein a computer-readable program for causing an encoding apparatus to perform an encoding method for alternately encoding two different block codes for every single codeword, in which one code has a reversed order against a part of the other code, the method comprising:
a provisional-encoding step of using a conversion rule of a first block code to perform provisional encoding;
a selection step of outputting a selection signal which selects the first block code or a second block code having reversed order to that of the first block code; and
a first bit determination step of determining the first bit of a final codeword according to the first bit value and the end-point state of a provisional codeword obtained by the process of the provisional-encoding step and the selection signal output by the process of the selection step.

9. A computer-executable program for controlling an encoding apparatus to perform a method for alternately encoding two different block codes for every single codeword, in which one code has a reversed order against a part of the other code, the method comprising:
a provisional-encoding step of using a conversion rule of a first block code to perform provisional encoding;
a selection step of outputting a selection signal which selects the first block code or a second block code having an order reverse to that of the first block code; and
a first bit determination step of determining the first bit of a final codeword according to the first bit value and the end-point state of a provisional codeword obtained by the process of the provisional-encoding step and the selection signal output by the process of the selection step.

10. An encoding method for alternately encoding two different block codes for every single codeword, in which one code has a reversed order against a part of the other code, the codeword being stored in a recording apparatus and accessible via a data processor, the method comprising:
a provisional-encoding step of using a conversion rule of a first block code to perform provisional encoding;
a selection step of outputting a selection signal which selects the first block code or a second block code having an order reverse to that of the first block code;
a selective order-reversing conversion step of reversing the order of a provisional code generated by the process of the provisional-encoding step, if necessary, to output the order-reversed provisional code, or outputting the provisional code as is, if order reversing is not necessary, according to the selection signal output by the process of the selection step; and
a first bit determination step of bit-wise inspecting the provisional code excluding the first bit, the provisional code being output by the process of the selective order-reversing conversion step, to determine the first bit of a final codeword.

11. An encoding method according to claim 10, wherein in the provisional-encoding step, a code division method is used to execute provisional encoding, and the final codeword is determined after provisional encoding is finished for all division codes of the codes.

12. An encoding apparatus for alternately encoding two different block codes for every single codeword, in which one code has a reversed order against a part of the other code, the apparatus comprising:
a provisional-encoding section for using a conversion rule of a first block code to perform provisional encoding;
a selection-signal output section for outputting a selection signal which selects the first block code or a second block code having an order reverse to that of the first block code;
a selective order-reversing conversion section for reversing the order of a provisional code generated by the provisional-encoding section, if necessary, to output the order-reversed provisional code, or outputting the provisional code as is, if order reversing is not necessary, according to the selection signal output from the selection-signal output section; and
a first bit determination section for bit-wise inspecting the provisional code excluding the first bit, the provisional code being output from the selective order-reversing conversion section, to determine the top code of a final codeword.

13. A recording medium having recorded therein a computer-readable program for causing an encoding apparatus to perform an encoding method for alternately encoding two different block codes for every single codeword, in which one code has a reversed order against a part of the other code, the method comprising:
a provisional-encoding step of using a conversion rule of a first block code to perform provisional encoding;
a selection step of outputting a selection signal which selects the first block code or a second block code having an order reverse to that of the first block code;
a selective order-reversing conversion step of reversing the order of a provisional code generated by the process of the provisional-encoding step, if necessary, to output the order-reversed provisional code, or outputting the provisional code as is, if order reversing is not necessary, according to the selection signal output by the process of the selection step; and
a first bit determination step of bit-wise inspecting the provisional code excluding the first bit, the provisional code being output by the process of the selective order-reversing conversion step to determine the first bit of a final codeword.

14. A computer-executable program for controlling an encoding apparatus to perform an encoding method for alternately encoding two different block codes for every single codeword, in which one code has a reversed order against a part of the other code, the method comprising:
- a provisional-encoding step of using a conversion rule of a first block code to perform provisional encoding;
- a selection step of outputting a selection signal which selects the first block code or a second block code having an order reverse to that of the first block code;
- a selective order-reversing conversion step of reversing the order of a provisional code generated by the process of the provisional-encoding step, if necessary, to output the order-reversed provisional code, or outputting the provisional code as is, if order reversing is not necessary, according to the selection signal output by the process of the selection step; and
- a first bit determination step of bit-wise inspecting the provisional code excluding the first bit, the provisional code being output by the process of the selective order-reversing conversion step, to determine the first bit of a final codeword.

15. A decoding method for alternately decoding two different block codes for every single codeword, in which one code has a reversed order against a part of the other code, the codeword being stored in a recording apparatus and accessible via a data processor, the method comprising:
- a detected-code obtaining step of obtaining a detected code;
- a first bit estimation step of bit-wise inspecting the detected code excluding the first bit, to estimate a new first bit; and
- a decoding step of decoding the new first bit and the detected code excluding the first bit; wherein
- in the decoding step, a code division method is used to perform decoding, and the end-point state of the first division code among division codes is used to decode subsequent division codes.

* * * * *